United States Patent
Kajita et al.

[11] Patent Number: 5,990,007
[45] Date of Patent: Nov. 23, 1999

[54] METHOD OF MANUFACTURING A SEMICONDUCTOR DEVICE

[75] Inventors: Akihiro Kajita; Katsuhiko Oya; Johta Fukuhara, all of Yokohama; Kenichi Otsuka, Kawasaki; Hitoshi Itoh, Tokyo, all of Japan

[73] Assignee: Kabushiki Kaisha Toshiba, Kawasaki, Japan

[21] Appl. No.: 08/979,783

[22] Filed: Nov. 26, 1997

[30] Foreign Application Priority Data

Nov. 29, 1996 [JP] Japan ................................ 8-319656
Aug. 6, 1997 [JP] Japan ................................ 9-211979

[51] Int. Cl.$^6$ .................................................. H01L 21/441
[52] U.S. Cl. ............................ 438/680; 438/683; 438/706
[58] Field of Search .................................. 438/622, 700, 438/723, 706, 675, 683, 761, 679, 680

[56] References Cited

U.S. PATENT DOCUMENTS

| | | | |
|---|---|---|---|
| 4,501,769 | 2/1985 | Hieber et al. ........................ | 438/683 |
| 5,498,768 | 3/1996 | Nishitani et al. ..................... | 438/723 |
| 5,605,867 | 2/1997 | Sato et al. ........................... | 438/790 |
| 5,620,925 | 4/1997 | Nakata et al. ........................ | 438/641 |
| 5,635,423 | 6/1997 | Huang et al. ........................ | 438/700 |

OTHER PUBLICATIONS

Hitoshi Itoh et al., "Production–Level Planarized Metallization for Lower Half–Micron Devices Using Tungsten Selective CVD", Conference Proceedings ULSI XI, Materials Research Society, pp. 467–473, Oct. 24–25, 1996.

S. E. Schulz et al., "Influence of Wafer Prelcean before Selective Tungsten CVD on Surface Properties of Interconnect and Intermetal Dielectric Materials", phys. stat. sol. (a) 145, pp. 311–318, May 31, 1994.

*Primary Examiner*—Robert Kunemund
*Assistant Examiner*—Duy-Vu Deo
*Attorney, Agent, or Firm*—Finnegan, Henderson, Farabow, Garrett & Dunner, L.L.P.

[57] ABSTRACT

This invention provides a method of manufacturing a semiconductor device, including the steps of forming an insulating film and a first metal film on one major surface of a semiconductor substrate, each of the insulating film and the first metal film having a partially exposed surface, and selectively forming a second metal film on the exposed surface of the first metal film, wherein formation of the second metal film is performed in an atmosphere containing a gasified silicon compound obtained upon gasifying a liquid silicon compound containing at least one element selected from the group consisting of carbon, hydrogen, oxygen, chlorine, and fluorine, or its reaction product, whereby the exposed surface of the insulating film is chemically modified with the silicon compound or its reaction product.

26 Claims, 8 Drawing Sheets

METHOD OF MANUFACTURING A SEMICONDUCTOR DEVICE

BACKGROUND OF THE INVENTION

The present invention relates to a method and apparatus for manufacturing a semiconductor device and, more particularly, to a method and apparatus for manufacturing a semiconductor device using selective growth of a metal.

In recent years, the integration density of semiconductor devices is increased by reducing the sizes of constituent elements. However, as the device feature size shrinks, various problems are arising in manufacturing processes.

For interconnections, the interconnection width is reduced to make a small device. Generally, in the manufacture of a semiconductor device, a contact hole is formed in an insulating film to electrically connect upper and lower interconnections separated by the insulating film. This contact hole size must be reduced as the interconnection width decreases. For this reason, the aspect ratio (depth/diameter) of contact holes is becoming high.

Conventionally, sputtering is used to fill a contact hole with a conductive material. Sputtering is a film formation technique generally used to form a metal thin film. However, when sputtering is used to fill a contact hole having a high aspect ratio with a metal, step coverage may be degraded at the bottom or side portion of the contact hole, or a void may be formed in the contact hole to result in an increase in electrical resistance. Therefore, a demand is arising for a film formation technique that allows formation of reliable interconnections even when contact holes have a high aspect ratio.

As one of such film formation techniques, so-called selective CVD for depositing a desired metal only in a contact hole using chemical vapor deposition (to be referred to as CVD hereinafter) is known.

Selective CVD is a technique of depositing a desired metal interconnection material only on a metal surface using the fact that the decomposition properties of a source gas used for film formation on the metal surface are different from those on an insulating surface. The contact hole is filled with the metal material by growing the desired metal film only on the bottom portion of the contact hole, i.e., the exposed surface of the lower interconnection while controlling the substrate to a predetermined temperature. For example, in tungsten selective CVD for selectively filling a contact hole with tungsten (W), selective growth is performed using, as a source gas, a gas mixture of tungsten hexafluoride ($WF_6$) and silane ($SiH_4$) while controlling the substrate to a predetermined temperature.

In many cases, however, when the contact hole is filled with tungsten, tungsten particles are generated not only in the contact hole but also on other insulating film surface portions. This phenomenon is known well as "selectivity loss". If upper interconnections are formed in the subsequent process, the tungsten particles generated on the insulating film surface may cause short circuit between the upper interconnections to result in interconnection failures. This "selectivity loss" is a serious problem in bringing tungsten selective growth into practice.

The "selectivity loss" is a problem in selective CVD using another metal material as well which is supposed to realize selective growth based on a similar mechanism. For example, aluminum CVD using alkyl aluminum and copper CVD using acetylacetonate-olefin-copper are also regarded as techniques for realizing selective growth in principle. However, these selective CVD techniques of forming metal films have not been put into practice as a method of manufacturing a semiconductor device because of the "selectivity loss".

As described above, it is important in the metal CVD techniques to maintain high selectivity in growing a desired metal. For this purpose, an ideal insulating film surface where metal nucleation sites are hardly generated, i.e., an insulating film surface which does not receive/give electrons from/to source gas molecules adsorbed in the insulating film surface must be prepared. Conversely, in a region where the desired metal material is be selectively grown, the metal material must be easy to deposit, i.e., the source gas must be immediately decomposed to the desired metal.

In the actual semiconductor device manufacturing process, however, an ideal insulating film surface where "selectivity loss" does not occur and the ideal metal surface is hard to obtain. This will be described below while exemplifying tungsten selective growth.

Normally, reactive ion etching (to be referred to as RIE hereinafter) is used to form a contact hole. For this reason, RIE damage or residue of reaction product of a resist is generated on the bottom portion of the contact hole. In addition, when the semiconductor substrate (wafer) is conveyed in the atmosphere after formation of the contact hole, the bottom portion of the contact hole oxidizes. In this way, a so-called RIE contaminated layer is formed at the bottom portion of the contact hole. Such an RIE contaminated layer must be removed because it impedes tungsten growth in the contact hole.

A semiconductor substrate having a contact hole is normally processed using a plasma of an inert gas to remove the RIE contaminated layer. At this time, an insulating film of, e.g., $SiO_2$ in which the contact hole is formed is also exposed to the plasma. Consequently, the surface of the insulating film is changed in properties and damaged.

If the surface of the $SiO_2$ film is processed by an Ar plasma, the ratio of Si to O deviates from the stoichiometric ratio to generate excess Si atoms. The excess Si atoms form dangling bonds on the surface of the $SiO_2$ film and activate the surface of the $SiO_2$ film. $WF_6$ or $SiH_4$ molecules are readily trapped by the dangling bonds to generate nuclei for growing tungsten particles on the $SiO_2$ film. Additionally, when the $SiO_2$ film surface is modified with hydroxyl groups generated upon reaction between defects on the $SiO_2$ film surface and residual water vapor in the vacuum chamber, nuclei for growing tungsten particles or tungsten nucleation on the $SiO_2$ film are easily generated.

When the surface of the $SiO_2$ film is activated, the selectivity of tungsten growth lowers. Thus, a technique of selectively growing tungsten while keeping the insulating film surface stable is desired.

As a method of removing the RIE contaminated layer, the semiconductor substrate is processed using a plasma of a halogen-based gas, as is known. In this method as well, the surface of the insulating film ($SiO_2$ film) having the contact hole is exposed to the plasma, as in use of the inert gas plasma. Although the insulating film surface is damaged, the damaged layer is sequentially removed because the insulating film is simultaneously chemically etched by active halogen ions. Therefore, damage to the insulating film surface is less serious relative to the use of the inert gas plasma.

However, as semiconductor devices are increasing in integration density in recent years, the interconnection pitch has reduced to the submicron order, so higher selectivity is required. Even when the halogen-based gas plasma is used, sufficient selectivity cannot always be obtained.

In addition, since a halogen gas is used as an etching gas, the surfaces of lower interconnections at the bottom portion of the contact hole are converted into a halide. When the contact hole is filled with tungsten to form a tungsten plug, a halide layer or a layer containing a large quantity of halogen remains at the interface between the tungsten plug and the lower interconnection. This increases the contact resistance between the tungsten plug and the lower interconnection.

Furthermore, the halogen remaining between the plug and the lower interconnection corrodes the interconnection layer mainly containing aluminum upon annealing in the subsequent multilevel interconnection formation process or absorbing water from the ambient around the semiconductor substrate.

There is one more factor that lowers the selectivity in tungsten selective CVD. Tungsten is grown on a semiconductor substrate in a vacuum process chamber. The semiconductor substrate accommodated in the process chamber is heated to give rise to a chemical reaction for depositing tungsten only on the semiconductor substrate. However, it is difficult to exclusively heat the semiconductor substrate, and members in the process chamber, other than the semiconductor substrate, are also heated. Consequently, tungsten film formation reaction takes place on these heated members, too.

Tungsten grown on the members other than the semiconductor substrate results in dust. The dust becomes nuclei for growing tungsten. When the dust adheres to the surface of the insulating film formed on the semiconductor substrate, the selectivity lowers.

To prevent the selectivity from lowering due to dust, the interior of the process chamber is cleaned by a plasma using fluorine gas to remove tungsten adhering to the process chamber. In the process chamber, jigs contacting the semiconductor substrate are normally formed from silica. The silica jigs are damaged by this cleaning, so tungsten readily grows in the subsequent CVD process. Therefore, the surfaces of silica jigs in the process chamber are also required to be stable.

As described above, when a metal is to be grown by the conventional method, a metal film is also formed on the insulating film surface because of, e.g., dangling bonds on the insulating film surface. That is, "selectivity loss" readily occurs. When a metal is to be selectively grown using the conventional method, the metal film also easily forms on the surfaces of silica members in the process chamber.

BRIEF SUMMARY OF THE INVENTION

It is an object of the present invention to provide a method and apparatus for manufacturing a semiconductor device which enable selective growth of a metal with high selectivity.

It is another object of the present invention to provide a method and apparatus for manufacturing a semiconductor device which enable manufacture of a semiconductor device having excellent electrical contact characteristics between lower interconnections and a selectively grown metal.

It is still another object of the present invention to provide a method and apparatus for manufacturing a semiconductor device which can suppress the growth of a metal on a silica member in the process chamber for selectively growing the metal on a semiconductor substrate, thereby facilitating maintenance/management of the process chamber.

In order to achieve the above objects, according to the present invention, there is provided a method of manufacturing a semiconductor device, comprising the steps of forming an insulating film and a first metal film on one major surface of a semiconductor substrate, each of the insulating film and the first metal film having a partially exposed surface, and selectively forming a second metal film on the exposed surface of the first metal film, wherein formation of the second metal film is performed in an atmosphere containing a gasified silicon compound obtained upon gasifying a liquid silicon compound containing at least one element selected from the group consisting of carbon, hydrogen, oxygen, chlorine, and fluorine, or a reaction product thereof, whereby the exposed surface of the insulating film is chemically modified with the silicon compound or the reaction product thereof.

According to the present invention, there is also provided a method of manufacturing a semiconductor device, comprising the steps of forming an insulating film and a first metal film on one major surface of a semiconductor substrate, each of the insulating film and the first metal film having a partially exposed surface, and selectively forming a second metal film on the exposed surface of the first metal film, wherein formation of the second metal film is performed in an atmosphere which contains a silicon compound consisting of silicon, carbon, and at least one element selected from the group consisting of hydrogen, oxygen, and a halogen, and in which the elements bonded to silicon are selected from the group consisting of silicon, carbon, oxygen, and a halogen, whereby the exposed surface of the insulating film is chemically modified with the silicon compound or a reaction product thereof.

According to the present invention, there is also provided a method of manufacturing a semiconductor device, comprising the steps of forming an insulating film and a first metal film on one major surface of a semiconductor substrate, each of the insulating film and the first metal film having a partially exposed surface, and selectively forming a second metal film on the exposed surface of the first metal film by CVD, wherein formation of the second metal film is performed in an atmosphere containing a gasified silicon compound obtained upon gasifying a liquid silicon compound containing at least one element selected from the group consisting of carbon, hydrogen, oxygen, chlorine, and fluorine, or a reaction product thereof, whereby the exposed surface of the insulating film is chemically modified with the silicon compound or the reaction product thereof.

According to the present invention, there is also provided a method of manufacturing a semiconductor device, comprising the steps of forming an insulating film and a first metal film on one major surface of a semiconductor substrate, each of the insulating film and the first metal film having a partially exposed surface, sputtering, using inert gas ions, the first metal film on the semiconductor film on which the insulating film and the first metal film are formed, thereby cleaning the first metal film, and selectively forming a second metal film on the cleaned exposed surface of the first metal film, wherein formation of the second metal film is performed in an atmosphere containing a gasified silicon compound obtained upon gasifying a liquid silicon compound containing at least one element selected from the group consisting of carbon, hydrogen, oxygen, chlorine, and fluorine, or a reaction product thereof, whereby the exposed surface of the insulating film is chemically modified with the silicon compound or the reaction product thereof.

According to the present invention, there is also provided a method of manufacturing a semiconductor device, comprising the steps of forming a metal interconnection on one major surface of a semiconductor substrate, forming an insulating film on the major surface of the semiconductor substrate on which the interconnection is formed, partially removing the insulating film to form a contact hole and at least partially expose a surface of the interconnection, and selectively forming a metal plug on the exposed surface of the interconnection, wherein formation of the metal plug is performed in an atmosphere containing a gasified silicon compound obtained upon gasifying a liquid silicon compound containing at least one element selected from the group consisting of carbon, hydrogen, oxygen, chlorine, and fluorine, or a reaction product thereof, whereby the exposed surface of the insulating film is chemically modified with the silicon compound or the reaction product thereof.

According to the present invention, there is also provided a method of manufacturing a semiconductor device, comprising the steps of forming an insulating film on one major surface of a semiconductor substrate, partially removing the insulating film to form an interconnection trench, forming a metal film in the interconnection trench and on the insulating film, selectively removing the metal film formed on the insulating film while leaving the metal film formed in the interconnection trench, and selectively forming a metal interconnection on the metal film formed in the interconnection trench, wherein formation of the metal interconnection is performed in an atmosphere containing a gasified silicon compound obtained upon gasifying a liquid silicon compound containing at least one element selected from the group consisting of carbon, hydrogen, oxygen, chlorine, and fluorine, or a reaction product thereof, whereby the exposed surface of the insulating film is chemically modified with the silicon compound or the reaction product thereof.

According to the present invention, there is also provided an apparatus for manufacturing a semiconductor device, comprising a process chamber for accommodating a semiconductor substrate having, on one major surface, a metal surface and an insulating surface, supply means for supplying, into the process chamber, a gasified silicon compound obtained upon gasifying a liquid silicon compound containing at least one element selected from the group consisting of carbon, hydrogen, oxygen, chlorine, and fluorine, or a reaction product thereof, and formation means for introducing a source gas into the process chamber to selectively form a metal film on the metal surface of the semiconductor substrate.

According to the present invention, there is also provided an apparatus for manufacturing a semiconductor device, comprising a process chamber for accommodating a semiconductor substrate having, on one major surface, a metal surface and an insulating surface, supply means for supplying, into the process chamber, a gasified silicon compound obtained upon gasifying a liquid silicon compound containing at least one element selected from the group consisting of carbon, hydrogen, oxygen, chlorine, and fluorine, or a reaction product thereof to chemically modify the insulating surface of the semiconductor substrate accommodated in the process chamber, and formation means for introducing a source gas into the process chamber to selectively form a metal film on the metal surface of the semiconductor substrate.

According to the present invention, there is also provided an apparatus for manufacturing a semiconductor device, comprising a process chamber for accommodating a semiconductor substrate having, on one major surface, a metal surface and an insulating surface, supply means for supplying an alkylsilanol into the process chamber to chemically modify the insulating surface of the semiconductor substrate accommodated in the process chamber with the alkylsilanol or a reaction product thereof, and formation means for introducing a source gas into the process chamber to selectively form a metal film on the metal surface of the semiconductor substrate.

According to the present invention, there is also provided an apparatus for manufacturing a semiconductor device, comprising a process chamber for accommodating a semiconductor substrate having, on one major surface, a metal surface and an insulating surface, supply means for supplying an alkylhalogen silicon into the process chamber to chemically modify the insulating surface of the semiconductor substrate accommodated in the process chamber with the alkylhalogen silicon or a reaction product thereof, and formation means for introducing a source gas into the process chamber to selectively form a metal film on the metal surface of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The present invention will be described below with reference to the accompanying drawings.

Figure 1:
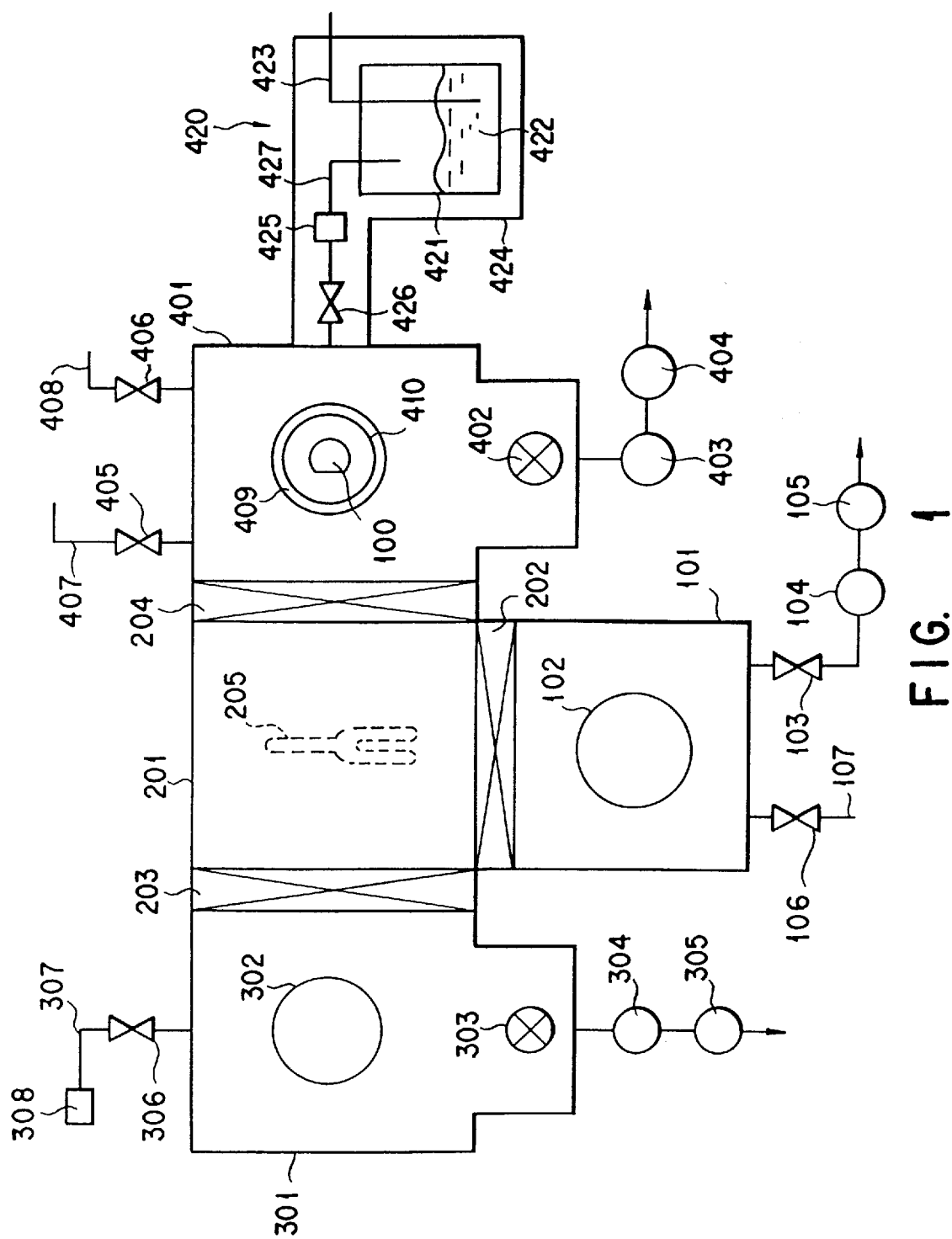
FIG. 1 is a view schematically showing an example of a semiconductor device manufacturing apparatus used in the present invention.

FIG. 1 schematically shows an example of a semiconductor device manufacturing apparatus used in the present invention. The manufacturing apparatus shown in FIG. 1 has vacuum chambers 101, 201, 301, and 401. The vacuum chambers 101, 301, and 401 are arranged to be adjacent each other via the vacuum chamber 201.

In the vacuum chamber 101, a wafer, i.e., a semiconductor substrate 100 is loaded into the apparatus. The ambient around the semiconductor substrate 100 is controlled herein from the atmospheric pressure to a vacuum. The vacuum chamber 201 is a conveyance portion arranged to convey the substrate 100 among the vacuum chambers. The vacuum chamber 301 is used to clean the substrate 100. In the vacuum chamber 401, a metal such as tungsten is grown on the substrate 100 which has been cleaned in the vacuum chamber 301. Gate valves 202, 203, and 204 each serving as a load lock are set between the vacuum chamber 201 and the vacuum chambers 101, 301, and 401, respectively.

The vacuum chambers will be described in more detail.

A substrate support table 102 on which the substrate 100 is mounted is placed almost at the central portion of the vacuum chamber 101. A turbo molecular pump 104 and a dry pump 105 are sequentially connected to the vacuum chamber 101 through a gate valve 103. The pressure in the vacuum chamber 101 is reduced by driving these pumps 104 and 105. One end of a pipe 107 having a stop valve 106 is connected to the vacuum chamber 101. The other end of the pipe 107 is connected to an inert gas supply unit (not shown). Therefore, when the stop valve 106 is opened to supply, from the inert gas supply unit, dry nitrogen from which water has been removed into the vacuum chamber 101 via the pipe 107, the pressure in the vacuum chamber 101 can be returned from the reduced state to the atmospheric pressure.

The vacuum chamber 201 has a robot arm 205 as a convey means. The substrate 100 is transferred among the vacuum chambers by the robot arm 205. The vacuum chamber 201 also serves as a buffer area for preventing residual gases in the respective vacuum chambers from mixing.

A substrate support table 302 is placed almost at the central portion of the vacuum chamber 301. The substrate 100 conveyed from the vacuum chamber 201 to the vacuum chamber 301 is mounted on the substrate support table 302. A turbo molecular pump 304 and a dry pump 305 are sequentially connected to the vacuum chamber 301 through a gate valve 303. The vacuum chamber 301 is evacuated by these pumps 304 and 305. One end of a pipe 307 is connected to the vacuum chamber 301. The other end of the pipe 307 is connected to a preprocess gas supply unit (not shown) which supplies a preprocess gas for cleaning the substrate. A stop valve 306 and a mass flow controller 308 are sequentially inserted into the pipe 307 from the vacuum chamber 301 side. When the stop valve 306 is opened, an inert gas such as $BCl_3$ or Ar or a gas mixture of a halogen gas such as Ar containing $F_2$ and an inert gas is supplied from the preprocess gas supply unit into the vacuum chamber 301.

The vacuum chamber 401 is a process chamber for forming a metal film of, e.g., tungsten on the substrate. A turbo molecular pump 403 and a dry pump 404 are sequentially connected to the vacuum chamber 401 through a gate valve 402. The vacuum chamber 401 is evacuated by these pumps 403 and 404. One end of a pipe 407 having a stop valve 405 is connected to the vacuum chamber 401. One end of a pipe 408 having a stop valve 406 is also connected to the vacuum chamber 401. The other end of each of the pipes 407 and 408 is connected to a source gas supply unit (not shown) for supplying a source gas such as $WF_6$ or $SiH_4$. When the stop valve 405 and 406 is opened, a source gas such as $WF_6$ or $SiH_4$ is supplied from the source gas supply unit into the vacuum chamber 401. A susceptor 410 incorporating a heater 409 for heating the substrate 100 is arranged at nearly the central portion of the vacuum chamber 401.

A supply means 420 is arranged outside the vacuum chamber 401. A vessel 421 which can be tightly closed and stores a liquid silicon compound such as a trialkylsilanol or a trialkylhalogen silicon compound is set in the supply means 420. A pipe 423 for supplying an inert gas into the liquid silicon compound in the vessel 421 is connected to the vessel 421. The liquid silicon compound is bubbled by supplying the inert gas through the pipe 423. One end of a pipe 427 having a mass flow controller 425 and a valve 426 is connected to the upper portion of the vessel 421. The other end of the pipe 427 is connected to the vacuum chamber 401. The liquid silicon compound stored in the vessel 421 can be heated by a heating means 424 comprising a heater or the like to generate a gasified silicon compound. The pipes 423 and 427 can also be heated by the heating means 424. When the valve 426 is opened to supply the inert gas from the pipe 423 while heating the pipe 423 by the heating means 424, the gasified silicon compound is supplied into the vacuum chamber 401 together with the inert gas via the pipe 427. The silicon compound may cause reaction such as decomposition or polymerization depending on the type of silicon compound to be used. Such a reaction product can also be used as far as it is gasified.

The first embodiment of the present invention using the above manufacturing apparatus will be described next with reference to FIGS. 2A to 2G. In this embodiment, "selectivity loss" is prevented by modifying defects on the insulating film surface with a silicon compound having hydroxyl groups in metal selective growth.

FIGS. 2A to 2G are sectional views showing steps in manufacturing a semiconductor device of the first embodiment of the present invention.

Figure 2A:
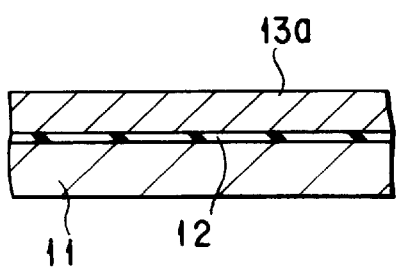
FIGS. 2A to 2G are sectional views schematically showing steps in manufacturing a semiconductor device of the first to third embodiments of the present invention.
Figure 2B:
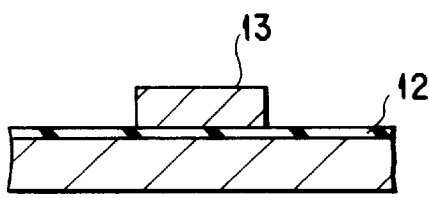
Figure 2C:
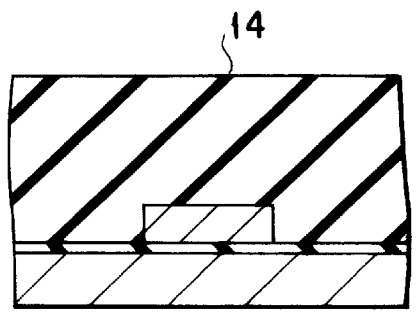

As shown in FIG. 2A, an $SiO_2$ film 12 having a thickness of 100 nm was formed on a silicon substrate 11. An Al alloy film 13a having a thickness of 400 nm was formed on the $SiO_2$ film 12 by sputtering. As shown in FIG. 2B, the Al alloy film 13a was patterned into a desired shape by conventional photo lithography and reactive ion etching to form an Al interconnection 13. As shown in FIG. 2C, an $SiO_2$ film 14 corresponding to a interlayer insulating film was deposited on the $SiO_2$ film 12 and the Al interconnection 13 by plasma CVD using TEOS (tetraethoxysilane) and $O_2$ as a source gas.

Figure 2D:
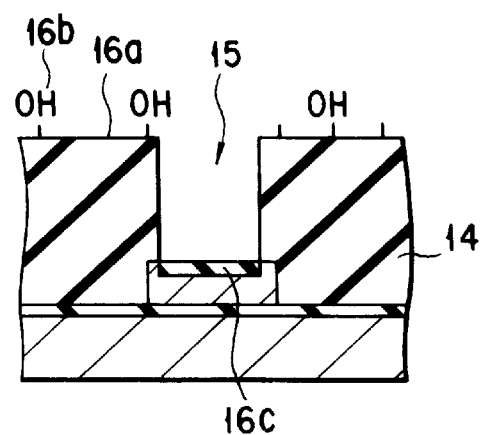
Figure 2E:
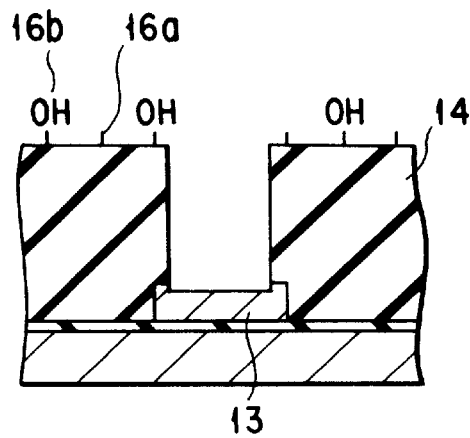

Next, as shown in FIG. 2D, a contact hole 15 was formed in the insulating film ($SiO_2$ film) 14 on the Al interconnection 13 using photo lithography and reactive ion etching. Defects such as dangling bonds 16a and hydroxyl-group-terminations 16b due to silicon more than the stoichiometric composition are present on the surface of the insulating film 14. To remove a native oxide film 16c on the Al interconnection 13 or a RIE contaminated layer, a preprocess was performed by reactive ion etching using $BCl_3$, as shown in FIG. 2E. In this process as well, defects as described above were formed on the insulating film 14.

When, after the above process, a tungsten layer is formed using the conventional technique, so-called "selectivity loss" occurs in a way to be described below. When a tungsten layer is to be formed on the Al interconnection 13 using $WF_6$ and $SiH_4$, $WF_6$ stays for a long time on the defects 16a and 16b on the surface of the insulating film 14, which serve as nuclei for growth. For this reason, $WF_6$ and $SiH_4$ react on the surface of the insulating film 14 to generate tungsten fluoride ($WF_x$) on the surface of the insulating film 14. This tungsten fluoride changes to tungsten as fluorine is gradually removed therefrom. Reaction of $WF_6$ and $SiH_4$ more preferentially occurs on a tungsten surface than on an insulating surface. For this reason, once tungsten is deposited on the defects 16a and 16b, tungsten growth on the defects 16a and 16b is prompted. As a result, hemispherical tungsten particles grow on the insulating film 14. In this way, the selectivity disappears, i.e., "selectivity loss" occurs.

In this embodiment, before the start of tungsten selective growth, a trialkylsilanol was introduced, and the semiconductor substrate conveyed into the vacuum chamber 401 shown in FIG. 1 was heated to 220° C. by the heater 409. As the trialkylsilanol, triethylsilanol ($Si(C_2H_5)_3OH$) in which three ethyl groups (—$C_2H_5$) and one hydroxyl group (—OH) were bonded to one silicon atom was used.

More specifically, the semiconductor substrate having a microstructure shown in FIG. 2E was loaded into the vacuum chamber 401 shown in FIG. 1, and thereafter, triethylsilanol was supplied into the vacuum chamber 401 while its flow rate was controlled by the mass flow controller 425. The triethylsilanol supplied into the vacuum chamber 401 was obtained by heating liquid triethylsilanol 422 stored in the vessel 421 shown in FIG. 1 by the heating means 424 and gasifying it by a normal bubbling method using argon gas as a carrier gas. The partial pressure of triethylsilanol in the vacuum chamber 401 was estimated to be roughly $10^{-5}$ Pa on the basis of the pressure of argon gas as a carrier gas in bubbling and the vapor pressure of triethylsilanol.

Figure 2F:
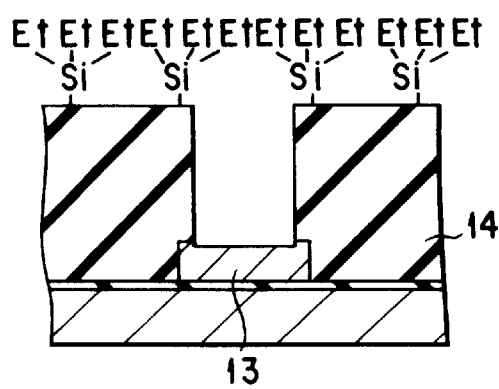

When triethylsilanol is introduced, the semiconductor substrate is exposed to an atmosphere containing triethylsilanol or its reaction product. Triethylsilanol is selectively chemically adsorbed in the defects 16a and 16b on the surface of the insulating film 14, as shown in FIG. 2F. The chemically adsorbed triethylsilanol prevents the defects 16a and 16b from becoming nuclei for tungsten growth or nucleation.

More specifically, triethylsilanol is physically adsorbed in the surface of the insulating film 14 through its hydroxyl groups first. The hydroxyl groups of triethylsilanol, which is physically adsorbed in the surface of the insulating film 14, immediately react with the dangling bond or hydroxyl groups on the surface of the insulating film 14 to form a strong chemical bond Si—O—Si. With this process, the defects 16a and 16b are considered to be terminated with the ethyl groups of triethylsilane. Since the ethyl group has a closed shell structure, i.e., hardly transfers electrons, $WF_6$ or $SiH_4$ are barely adsorbed in the defects 16a and 16b, so tungsten growth on the surface of the insulating film 14 can be suppressed. That is, "selectivity loss" can be prevented.

Figure 2G:
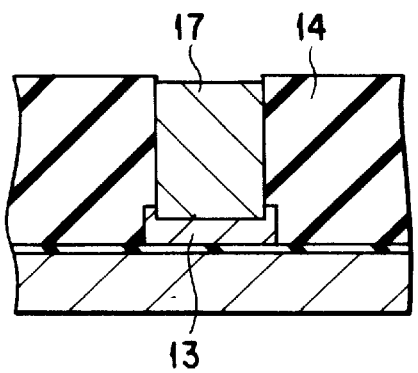

In the contact hole 15, decomposition of $WF_6$ to tungsten progresses on the conductive surface. Therefore, a tungsten layer 17 can be selectively grown only on the Al interconnection 13, as shown in FIG. 2G.

Triethylsilanol is preferably continuously supplied into the process chamber while the semiconductor substrate is being exposed to the atmosphere of $WF_6$ and $SiH_4$. The times of start and end of triethylsilanol introduction into the process chamber may be within the following range.

Supply of triethylsilanol into the process chamber is preferably started simultaneously when or before the semiconductor substrate is exposed to the atmosphere of $WF_6$ and $SiH_4$. Especially, when supply of triethylsilanol is started before the semiconductor substrate is exposed to the atmosphere of $WF_6$ and $SiH_4$ to sufficiently chemically modify the defects on the insulating film surface with triethylsilanol, "selectivity loss" can be more effectively prevented.

Supply of triethylsilanol into the process chamber is preferably ended simultaneously when or after supply of $WF_6$ and $SiH_4$ into the process chamber is ended. Especially, when supply of triethylsilanol is ended simultaneously with the end of supply of $WF_6$ and $SiH_4$ into the process chamber, the surface of the selectively grown tungsten layer can be prevented from being contaminated with triethylsilanol.

In addition, before the semiconductor substrate is conveyed into the process chamber, triethylsilanol is preferably supplied into the process chamber in advance to chemically modify the surfaces of silica members in the process chamber. With this process, deposition of tungsten on the surfaces of silica members can be suppressed according to the same principle as described above, so generation of dust in the process chamber can be suppressed.

Although, in the above embodiment, triethylsilanol is used as a silicon compound having hydroxyl groups, another alkylsilanol can also be used. However, the alkylsilanol is preferably an alkyl group having only one hydroxyl group and whose remaining substituting groups bonded to silicon atoms are chemically inactive. If alkylsilanol having a plurality of hydroxyl groups chemically modifies the insulating film surface, unreacted hydroxyl groups may remain. Such unreacted hydroxyl groups become nuclei for tungsten growth. However, trialkylsilanol having only one hydroxyl group never leaves it unreacted, so "selectivity loss" can be more effectively prevented.

In addition to triethylsilanol, trimethylsilanol ($Si(CH_3)_3OH$) or tripropylsilanol ($Si(C_3H_7)OH$) can be used as a trialkylsilanol. The trialkylsilanol need not always have alkyl groups of the same type and may have alkyl groups of different types, e.g., one ethyl group and two methyl groups. A silicon compound in which the alkyl groups of alkylsilanol are replaced with fluorocarbon groups such as trifluorocarbon groups (—$CF_3$) may also be used.

A compound having a plurality of silicon atoms in a molecule can be used as a silicon compound having hydroxyl groups. More specifically, a silicon compound in which an Si—Si bond or Si—O—Si bond is present in a molecule, and substituting groups bonded to silicon are alkyl and hydroxyl groups can also be used.

As described above, it is important that the silicon compound having hydroxyl groups and used in the first embodiment of the present invention contains at least one hydroxyl group, and remaining substituting groups are chemically inactive.

In the first embodiment, a liquid triethylsilanol was used as a silicon compound having hydroxyl groups. Although a solid silicon compound can also be used, a liquid silicon compound is preferably used. When a liquid silicon compound is used, the concentration of the silicon compound in the process chamber can be properly and easily controlled. When the liquid silicon compound is used, a film can be formed at an optimum silicon compound concentration, so "selectivity loss" can be more effectively prevented.

The second embodiment of the present invention using the manufacturing apparatus shown in FIG. 1 will be described with reference to FIGS. 2A to 2G. In this embodiment, "selectivity loss" is prevented by using a silicon compound having a silicon-halogen bond in selective growth of a metal.

As in the first embodiment, an $SiO_2$ film 12, an insulating film 14, and an Al interconnection 13 were formed on a substrate 11, and a preprocess was performed by reactive ion etching, as shown in FIG. 2E. Before tungsten growth was started, triethylchlorosilane ($Si(C_2H_5)_3Cl$) was supplied into the process chamber to chemically modify the surfaces of silica members in the process chamber.

Subsequently, the semiconductor substrate having a microstructure shown in FIG. 2E was conveyed into a process chamber 401 shown in FIG. 1, and the semiconductor substrate was heated to 220° C. by a heater 409. Next, triethylchlorosilane was introduced into the process chamber 401 while the flow rate was controlled by a mass flow controller 425. Triethylchlorosilane introduced into the process chamber 401 was obtained by heating liquid triethylchlorosilane 422 stored in a vessel 421 shown in FIG. 1 by a heating means 424 and gasifying the triethylchlorosilane by normal bubbling using argon gas as a carrier gas. The partial pressure of triethylchlorosilane in the process chamber 401 was estimated to be roughly $10^{-5}$ Pa on the basis of the pressure of argon gas as a carrier gas in bubbling and the vapor pressure of triethylchlorosilane.

When triethylchlorosilane is introduced, the semiconductor substrate is exposed to an atmosphere containing triethylchlorosilane or its reaction product. Triethylchlorosilane is selectively chemically adsorbed in defects 16a and 16b on the surface of the insulating film 14, as shown in FIG. 2F. The chemically adsorbed triethylchlorosilane prevents the defects 16a and 16b from becoming nuclei for tungsten growth.

More specifically, triethylchlorosilane is physically adsorbed in the surface of the insulating film 14 through its chlorine atoms first. The triethylchlorosilane which is physically adsorbed in the surface of the insulating film 14 immediately reacts with the dangling bonds or hydroxyl groups on the surface of the insulating film 14 to form strong chemical bonds Si—O—Si, Si—Si, and Si—Cl. With this process, the defects 16a and 16b are considered to be terminated with the ethyl groups of triethylsilane or chlorine atoms. As a result, $WF_6$ or $SiH_4$ is barely adsorbed in the surface of the insulating film 14, so tungsten growth on the surface of the insulating film 14 can be suppressed. That is, "selectivity loss" can be prevented.

In a contact hole 15, decomposition of $WF_6$ to tungsten progresses on the conductive surface. Therefore, a tungsten layer 17 can be selectively grown only on the Al interconnection 13, as shown in FIG. 2G. At this time, triethylchlorosilane supplied into the process chamber to improve the selectivity is considered to react with the surface of the Al interconnection 13 at the bottom portion of the contact hole to form aluminum chloride. This aluminum chloride has a relatively high vapor pressure. For this reason, the aluminum chloride evaporates due to heat given to the substrate in tungsten growth, so the aluminum surface is kept clean. Therefore, when triethylchlorosilane is used, "selectivity loss" can be effectively prevented without impeding tungsten growth on the Al interconnection 13.

The relationship between the time of supply of a gas (triethylchlorosilane) for suppressing "selectivity loss" and the time of supply of a gas ($WF_6$ and $SiH_4$) used as a material of a metal to be selectively grown is the same as in the above-described first embodiment.

Additionally, as in the first embodiment, before the semiconductor substrate is conveyed into the process chamber, the gas for suppressing "selectivity loss" is supplied into the process chamber in advance to chemically modify the inner surface of the process chamber.

Although, in the above embodiment, triethylchlorosilane was used as a silicon compound having a silicon-halogen bond, another alkylhalogen silicon compound can also be used. However, if the silicon compound has a plurality of halogen atoms bonded to silicon atoms, silicon compound molecules may bond with each other to form a polymer. Therefore, as a silicon compound having a silicon-halogen bond, a trialkylhalogen silicon compound such as triethylfluorosilane is preferably used.

In addition to the ethyl group, examples of alkyl groups which may be used in the above-described trialkylhalogen silicon compound include a methyl group, a propyl group, and a butyl group. The trialkylhalogen silicon compound need not always have alkyl groups of the same type and may have alkyl groups of different types, e.g., one ethyl group and two methyl groups. A silicon compound in which the alkyl group of an alkylhalogen silicon compound is substituted with a fluorocarbon group such as a trifluorocarbon group ($—CF_3$) may also be used.

A compound having a plurality of silicon atoms in a molecule can be used as a silicon compound having a silicon-halogen bond. More specifically, a silicon compound in which an Si—Si bond or Si—O—Si bond is present in a molecule, and substituting groups bonded to silicon are alkyl groups and the halogen atoms can also be used.

As described above, it is important that the silicon compound having hydroxyl groups and used in the second embodiment of the present invention contains at least one halogen atom bonded to silicon atoms, and the remaining substituting groups are chemically inactive.

In the second embodiment, liquid triethylchlorosilane was used as a silicon compound having a silicon-halogen bond. Although a solid silicon compound can also be used, a liquid silicon compound is preferably used. When a liquid silicon compound is used, the concentration of the silicon compound in the process chamber can be properly and easily controlled. When the liquid silicon compound is used, a film can be formed at an optimum silicon compound concentration, so "selectivity loss" can be more effectively prevented.

The relationship between the interconnection pitch and the short yield was checked for each of the manufacturing methods of the first and second embodiments and the conventional manufacturing method in the following manner.

Figure 3:
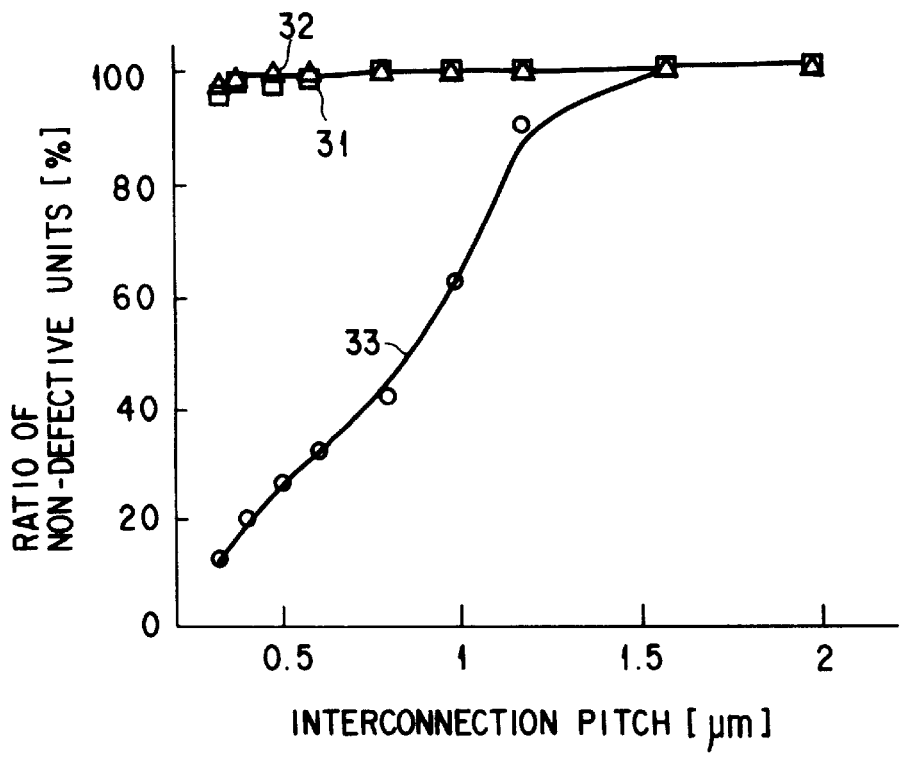
FIG. 3 is a graph showing the relationship between the interconnection pitch and the short yield.

Using each of the manufacturing methods of the first and second embodiments and the conventional manufacturing method, a contact hole having a diameter of 0.5 µm and formed on the surface of a substrate was filled and aluminum interconnections were formed on the resultant structure. The aluminum interconnections were formed at various pitches, and the short yield between the aluminum interconnections was measured. FIG. 3 shows the measurement results.

FIG. 3 is a graph showing the relationship between the interconnection pitch and the short yield. In FIG. 3, the abscissa represents the aluminum interconnection pitch, and the ordinate represents the ratio of non-defective units. Curves 31, 32, and 33 indicate data of the manufacturing method of the first embodiment, that of the second embodiment, and the conventional manufacturing method, respectively.

As is apparent from FIG. 3, when the interconnection pitch was reduced in use of the conventional manufacturing method, the ratio of non-defective units largely lowered. To the contrary, in the manufacturing methods of the first and second embodiments, even when the interconnection pitch was made small, a high ratio of non-defective units was maintained. That is, when the manufacturing methods of the first and second embodiments were used, the short yield could be greatly improved as compared to the conventional manufacturing method.

The ratio of occurrence of selectivity loss was checked in the following manner for each of the manufacturing methods of the first and second embodiments and the conventional manufacturing method.

Figure 4:
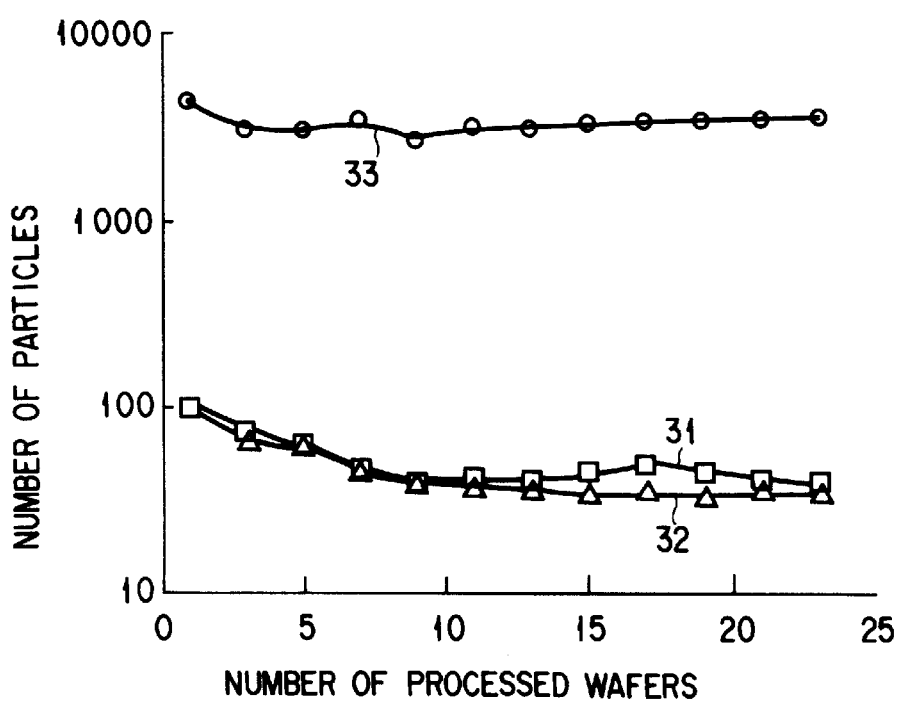
FIG. 4 is a graph showing the relationship between the number of processed wafers and the number of tungsten particles generated per wafer.

An insulating film ($SiO_2$ film) having a thickness of 100 nm was formed on the entire surface of a semiconductor substrate (wafer) by thermal oxidation. This semiconductor substrate was subjected to preprocess using a $BCl_3$ plasma, as in conventional tungsten selective CVD, and loaded into a CVD process chamber. The substrate in the CVD process chamber was heated to 220° C., and $WF_6$ and $SiH_4$ were supplied into the CVD process chamber for two minutes. In introduction of $WF_6$ and $SiH_2$ into the CVD process chamber, triethylsilanol was simultaneously supplied in the manufacturing method of the first embodiment, and triethylchlorosilane in the manufacturing method of the second embodiment. For the conventional manufacturing method, no silicon compound was supplied into the CVD process chamber together with $WF_6$ and $SiH_4$. A large number of wafers were processed, and the number of tungsten particles generated on the surface of the insulating film of each wafer due to selectivity loss were counted by a dust counter. Twenty-four wafers were processed for each manufacturing method, and only tungsten particles having a size of 0.2 $\mu$m or more were counted. FIG. 4 shows the results.

FIG. 4 is a graph showing the relationship between the number of processed wafers and the number of tungsten particles generated per wafer. In FIG. 4, the abscissa represents the number of processed wafers, and the ordinate represents the number of tungsten particles generated per wafer. Curves 31, 32, and 33 represent data in use of the manufacturing method of the first embodiment, that of the second embodiment, and the conventional manufacturing method, respectively.

As is apparent from this graph, in the conventional manufacturing method, the number of tungsten particles generated per wafer exceeded 1,000. When the conventional manufacturing method was used, selectivity loss occurred a considerable number of times in the semiconductor device manufacturing process. However, when the manufacturing method of the first or second embodiments was used, tungsten particles generated for each of the 24 wafers were smaller than 100. As described above, selectivity loss could be effectively suppressed by using the manufacturing method of the first or second embodiment as compared to the conventional manufacturing method.

The third embodiment of the present invention using the manufacturing apparatus shown in FIG. 1 will be described next with reference to FIGS. 2A to 2G. In this embodiment, selective aluminum growth is performed, unlike the first and second embodiments.

As in the first embodiment, an $SiO_2$ film 12, an insulating film 14, and an Al interconnection 13 were formed on a substrate 11, and preprocess by reactive ion etching was performed, as shown in FIG. 2E. Before tungsten growth was started, triethylchlorosilane ($Si(C_2H_5)_3Cl$) was supplied into the process chamber to chemically modify the surfaces of silica members in the process chamber.

Subsequently, the semiconductor substrate having a microstructure shown in FIG. 2E was conveyed into a process chamber 401 shown in FIG. 1, and the semiconductor substrate was heated to 300° C. by a heater 409. Next, triethylchlorosilane was introduced into the process chamber 401 while the flow rate was controlled by a mass flow controller 425. The triethylchlorosilane introduced into the process chamber 401 was obtained by heating liquid triethylchlorosilane 422 stored in a vessel 421 shown in FIG. 1 by a heating means 424 and gasifying the triethylchlorosilane by normal bubbling using argon gas as a carrier gas. The partial pressure of triethylchlorosilane in the process chamber 401 was estimated to be roughly $10^{-5}$ Pa on the basis of the pressure of argon gas as a carrier gas in bubbling and the vapor pressure of triethylchlorosilane.

When triethylchlorosilane is introduced, the semiconductor substrate is exposed to an atmosphere consisting of triethylchlorosilane or its reaction product. Triethylchlorosilane is selectively chemically adsorbed in defects 16a and 16b on the surface of the insulating film 14, as shown in FIG. 2F, to prevent the defects 16a and 16b from becoming nuclei for aluminum growth or nucleation.

In this embodiment, tri-isobutyl aluminum ($Al(i-C_4H_9)_3$) which is a liquid at room temperature was used as a source gas for selective CVD of aluminum. This liquid tri-isobutyl aluminum was supplied into the process chamber by the normal bubbling method. Argon gas was used as a bubbling gas.

To decompose the source gas, the source gas must receive electrons from the substrate surface. On a clean $SiO_2$ surface or $SiO_2$ surface modified with triethylchlorosilane, decomposition of the aluminum source gas is suppressed. To the contrary, in the contact hole, decomposition of the aluminum source gas progresses on the conductive surface. Therefore, an aluminum layer 17 can be selectively grown only on the lower interconnection 13, as shown in FIG. 2G.

As the source gas for aluminum CVD, another alkylaluminum or alkylaminoalane such as dimethylaluminum hydride ($Al(CH_3)_2H$) or trimethylaminoalane ($AlH_3N(CH_3)_3$) can be used in addition to tri-isobutyl aluminum.

The relationship between the time of supply of a gas (triethylchlorosilane) for suppressing selectivity loss and that of a gas (e.g., tri-isobutyl aluminum) used as a material of a metal to be selectively grown may be the same as in the above-described first embodiment. However, since alkylaluminum has very high reactivity, supply of triethylchlorosilane into the process chamber is preferably stopped before the aluminum source gas is supplied into the process chamber. This is to prevent the vapor phase reaction of alkylaluminum and triethylchlorosilane.

In addition, as in the first embodiment, before the semiconductor substrate is loaded into the process chamber, the gas for suppressing selectivity loss is supplied into the process chamber in advance to chemically modify the inner surface of the process chamber.

In this embodiment, triethylchlorosilane was used as an alkylhalogen silicon compound. Even when another silicon compound in which halogen atoms or alkyl groups are bonded to silicon atoms is used, the selectivity can be improved as in the second embodiment. An alkylsilanol described in the first embodiment may be used. Even when a silicon compound in which alkyl groups are substituted with fluorocarbon groups such as trifluorocarbon is used, the same effect as described above can be obtained.

The fourth embodiment of the present invention using the manufacturing apparatus shown in FIG. 1 will be described next with reference to FIGS. 5A and 5B. In this embodiment, selective CVD of copper is performed.

Figure 5A:
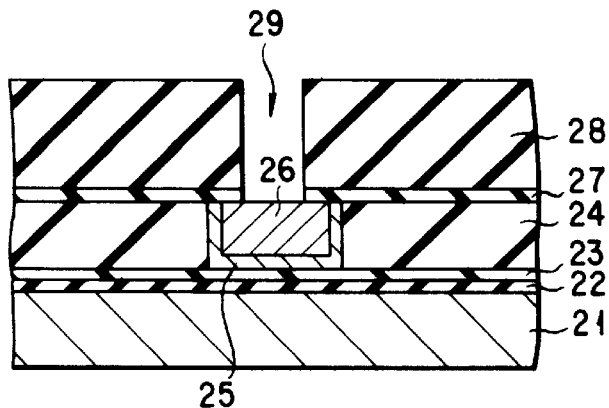
FIGS. 5A and 5B are sectional views schematically showing steps in manufacturing a semiconductor device of the fourth embodiment of the present invention.
Figure 5B:
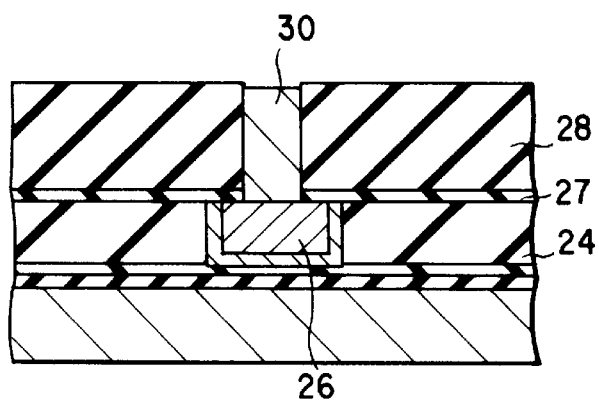

FIGS. 5A and 5B are sectional views showing steps in manufacturing a semiconductor device according to the fourth embodiment of the present invention.

As in the first embodiment, an $SiO_2$ film 22 having a thickness of 50 nm was formed on a silicon substrate 21 by thermal oxidation, as shown in FIG. 5A. An SiN film 23 having a thickness of 50 nm was formed next by plasma CVD. An $SiO_2$ film 24 having a thickness of 400 nm was formed on the SiN film 23 by plasma CVD using TEOS and $O_2$ as a source gas. A trench having a width of 400 nm was formed in the $SiO_2$ film 24 using conventional photo lithography and reactive ion etching. A TiN film 25 having a thickness of 30 nm and a copper film 26 were sequentially deposited on the silicon substrate 21 having the trench by sputtering to fill the trench formed in the $SiO_2$ film 24 with copper. The copper outside the trench was removed by chemical mechanical polishing (CMP) to form the copper interconnection 26 in the trench. An SiN film 27 having a thickness of 50 nm was formed on the interconnection 26 by plasma CVD. An $SiO_2$ film 28 having a thickness of 800 nm was formed on the SiN film 27 by plasma CVD using TEOS and $O_2$ as a source gas. A contact hole 29 was formed in the $SiO_2$ film 28 and the SiN film 27 positioned on the copper interconnection 26 using conventional photo lithography and reactive ion etching.

The semiconductor substrate formed in the above way shown in FIG. 5A was heated in a hydrogen reduction atmosphere. With this process, copper oxide present on the exposed surface of the copper interconnection 26 was reduced to copper.

The semiconductor substrate was transferred into a process chamber 401 shown in FIG. 1 and heated to 160° C. by a heater 409, so that a reoxidizing of the reduced copper surface is prevented. Next, triethylchlorosilane was introduced into the process chamber 401 while the flow rate was controlled by a mass flow controller 425. The triethylchlorosilane introduced into the process chamber 401 was obtained by heating liquid triethylchlorosilane 422 stored in a vessel 421 shown in FIG. 1 by a heating means 424 and gasifying the triethylchlorosilane by normal bubbling using argon gas as a carrier gas. The partial pressure of triethylchlorosilane in the process chamber 401 was estimated to be roughly $10^{-5}$ Pa on the basis of the pressure of argon gas as a carrier gas in bubbling and the vapor pressure of triethylchlorosilane.

When triethylchlorosilane is introduced, the semiconductor substrate is exposed to an atmosphere containing triethylchlorosilane or its reaction product. Triethylchlorosilane is selectively chemically adsorbed in defects on the surface of the insulating film to prevent the defects from becoming nuclei for copper growth or nucleation.

In this embodiment, hexafluoroacetylacetone trimethylvinylsilane copper ($[CF_3CO]_2CH.C_5H_{12}Si.Cu$) as a liquid at room temperature was used as a source gas for selective CVD of copper. This liquid hexafluoroacetylacetone trimethylvinylsilane copper was supplied into the process chamber by the normal bubbling method. Argon gas was used as a bubbling gas.

Decomposition of the source gas is assumed to progress upon receiving electrons from the substrate surface. On a clean $SiO_2$ surface or $SiO_2$ surface modified with triethylchlorosilane, decomposition of the copper source gas is suppressed by sufficiently lowering the substrate temperature. To the contrary, in the contact hole, decomposition of the copper source gas progresses on the conductive surface. Therefore, the contact hole 29 can be selectively filled with copper 30, as shown in FIG. 5B.

As the source gas for copper CVD, an acetylacetone-copper compound such as a hexaacetylacetone olefin copper compound or hexaacetylacetone alkine copper compound can be used in addition to hexafluoroacetylacetone trimethylvinylsilane copper.

The relationship between the time of supply of a gas (triethylchlorosilane) for suppressing selectivity loss and the time of supply of a gas (e.g., hexafluoroacetylacetone trimethylvinylsilane copper) used as a material of a metal to be selectively grown is the same as in the above-described first embodiment.

Additionally, as in the first embodiment, before the semiconductor substrate is conveyed into the process chamber, the gas for suppressing selectivity loss is supplied into the process chamber in advance to chemically modify the inner surface of the process chamber.

In this embodiment, triethylchlorosilane was used as an alkylhalogen silicon compound. Even when another silicon compound in which halogen atoms or alkyl groups are bonded to silicon atoms is used, the selectivity can be improved as in the second embodiment. An alkylsilanol described in the first embodiment may be used. Even when a silicon compound in which alkyl groups are substituted with fluorocarbon groups such as trifluorocarbon groups is used, the same effect as described above can be obtained.

The fifth embodiment of the present invention using the manufacturing apparatus shown in FIG. 1 will be described next with reference to FIGS. 6A to 6G. In this embodiment, a filled copper interconnection is formed using selective CVD of copper.

FIGS. 6A to 6G are sectional views showing steps in manufacturing a semiconductor device of the fifth embodiment of the present invention.

Figure 6A:
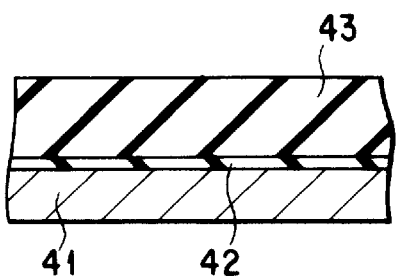
FIGS. 6A to 6G are sectional views schematically showing steps in manufacturing a semiconductor device of the fifth embodiment of the present invention.
Figure 6B:
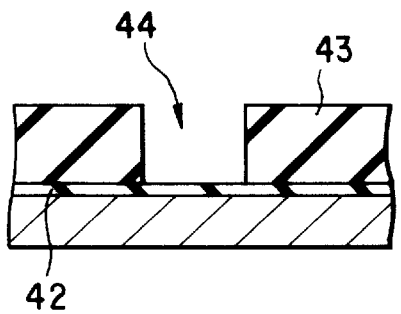

As shown in FIG. 6A, an $SiO_2$ film 42 having a thickness of 100 nm was formed on a silicon substrate 41. An $SiO_2$ film 43 having a thickness of 400 nm was formed on the $SiO_2$ film 42 by plasma CVD using TEOS and $O_2$ as a source gas. As shown in FIG. 6B, a trench 44 was formed in the $SiO_2$ film 43 using conventional photo lithography and reactive ion etching.

Figure 6C:
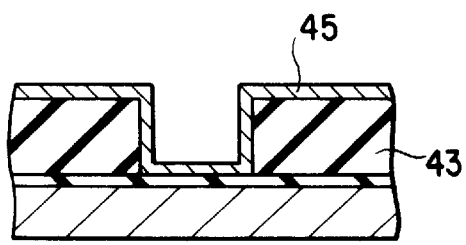
Figure 6D:
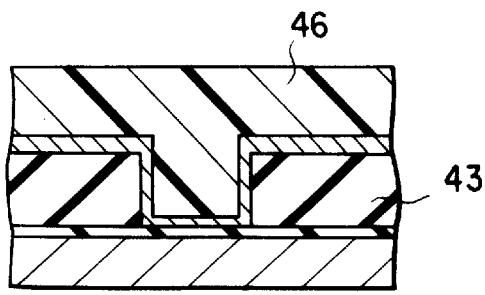

As shown in FIG. 6C, a TiN film 45 having a thickness of 30 nm was deposited by sputtering. As shown in FIG. 6D, a resist 46 was applied to a thickness of 1.4 $\mu$m to planarize the surface. The resist 46 was etched back until the TiN film 45 outside the trench was removed. The resist remaining in the trench was removed by ashing using an oxygen plasma.

Figure 6E:
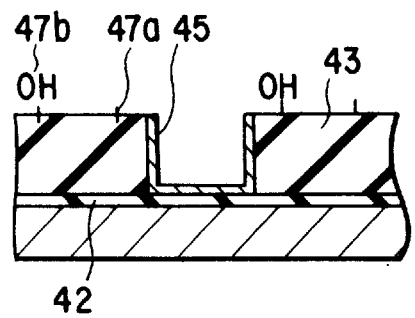

In this way, the TiN film 45 was formed only on the inner wall of the trench 44, as shown in FIG. 6E. At this time, defects 47a and 47b were formed on the insulating film 43 by the plasma process.

The resultant semiconductor substrate shown in FIG. 6E was loaded into a preprocess chamber, and titanium oxide and an RIE contaminated layer present on the surface of the TiN film 45 were removed by reactive ion etching using $BCl_3$ as an etching gas. Thereafter, the semiconductor substrate was conveyed into a process chamber 401 in FIG. 1 without exposing it to an oxidation atmosphere. The substrate temperature was held at 160° C. using a heater 409.

Next, triethylchlorosilane was introduced into the process chamber 401 while the flow rate was controlled by a mass flow controller 425. The triethylchlorosilane introduced into the process chamber 401 was obtained by heating liquid triethylchlorosilane 422 stored in a vessel 421 shown in FIG. 1 by a heating means 424 and gasifying the triethylchlorosilane by normal bubbling using argon gas as a carrier gas. The partial pressure of triethylchlorosilane in the process chamber 401 was estimated to be roughly $10^{-5}$ Pa on the basis of the pressure of argon gas as a carrier gas in bubbling and the vapor pressure of triethylchlorosilane.

Figure 6F:
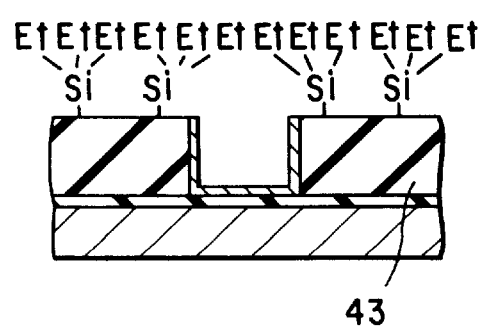

When triethylchlorosilane is introduced, the semiconductor substrate is exposed to an atmosphere containing triethylchlorosilane or its reaction product. As shown in FIG. 6F, triethylchlorosilane is selectively chemically adsorbed in defects on the surface of the insulating film 43 to prevent the defects from becoming nuclei for copper growth.

In this embodiment, hexafluoroacetylacetone trimethylvinylsilane copper ($[CF_3CO]_2CH.C_5H_{12}Si.Cu$) which is a liquid at room temperature was used as a source gas for selective CVD of copper. This liquid hexafluoroacetylacetone trimethylvinylsilane copper was supplied into the process chamber by the normal bubbling method. Argon gas was used as a bubbling gas.

Figure 6G:
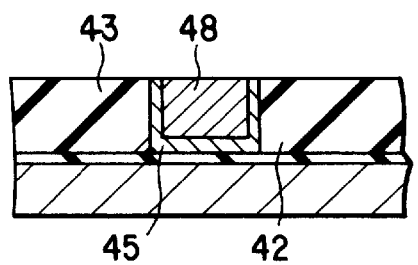

Decomposition of the source gas is presumed to progress upon receiving electrons from the substrate surface. On a clean $SiO_2$ surface or $SiO_2$ surface modified with triethylchlorosilane, decomposition of the copper source gas is suppressed by sufficiently lowering the substrate temperature. To the contrary, in the trench 44, decomposition of the copper source gas progresses on the conductive surface of the TiN film 45, so the copper can be selectively grown only on the TiN film 45. Therefore, the trench can be selectively filled with copper 48, as shown in FIG. 6G.

As the source gas for copper CVD, an acetylacetone-copper compound such as a hexaacetylacetone olefin copper compound or hexaacetylacetone alkine copper compound can be used in addition to hexafluoroacetylacetone trimethylvinylsilane copper.

The relationship between the time of supply of a gas (triethylchlorosilane) for suppressing selectivity loss and the time of supply of a gas (e.g., hexafluoroacetylacetone trimethylvinylsilane copper) used as a material of a metal to be selectively grown is the same as in the above-described first embodiment.

Additionally, as in the first embodiment, before the semiconductor substrate is conveyed into the process chamber, the gas for suppressing selectivity loss is supplied into the process chamber in advance to chemically modify the inner surface of the process chamber.

In this embodiment, triethylchlorosilane was used as an alkylhalogen silicon compound. Even when a silicon compound in which halogen atoms or alkyl groups are bonded to silicon atoms is used, the selectivity can be improved as in the second embodiment. An alkylsilanol described in the first embodiment may be used. Even when a silicon compound in which alkyl groups are substituted with fluorocarbon groups such as trifluorocarbon groups is used, the same effect as described above can be obtained.

The sixth embodiment of the present invention using the manufacturing apparatus shown in FIG. 1 will be described next with reference to FIGS. 7A to 7G. In this embodiment, after a preprocess by sputter etching using Ar ions is performed, tungsten selective CVD is performed while supplying an alkylsilanol, thereby forming a tungsten plug.

FIGS. 7A to 7G are sectional views showing steps in manufacturing a semiconductor device according to the sixth embodiment of the present invention.

Figure 7A:
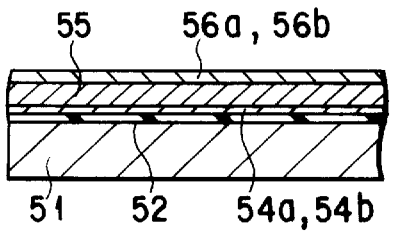
FIGS. 7A to 7G are sectional views schematically showing steps in manufacturing a semiconductor device of the sixth and seventh embodiments of the present invention.

As shown in FIG. 7A, an insulating film ($SiO_2$ film) 52 having a thickness of 100 nm was formed on a silicon substrate 51. A titanium (Ti) film 54$a$ having a thickness of 10 nm and a titanium nitride (TiN) film 54$b$ having a thickness of 20 nm were sequentially formed on the $SiO_2$ film 52 by sputtering. An Al alloy film 55 having a thickness of 400 nm was formed by sputtering. A Ti film 56$a$ having a thickness of 5 nm and a TiN film 56$b$ having a thickness of 60 nm were sequentially formed on the Al alloy film 55 by sputtering.

Figure 7B:
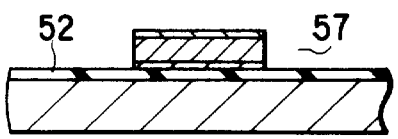

As shown in FIG. 7B, the stacked metal thin films, i.e., the TiN/Ti/Al alloy/TiN/Ti layer was patterned into a desired pattern using conventional photo lithography and reactive ion etching to form an interconnection 57.

Figure 7C:
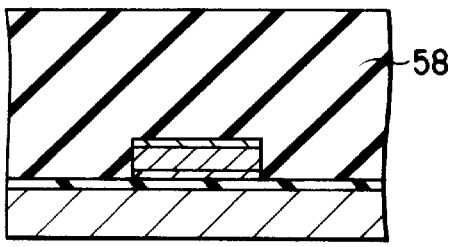

As shown in FIG. 7C, an $SiO_2$ film 58 having a thickness of 1 $\mu$m was formed by plasma CVD using TEOS and $O_2$ as a source gas. This $SiO_2$ film 58 corresponds to a interlayer insulating film.

Figure 7D:
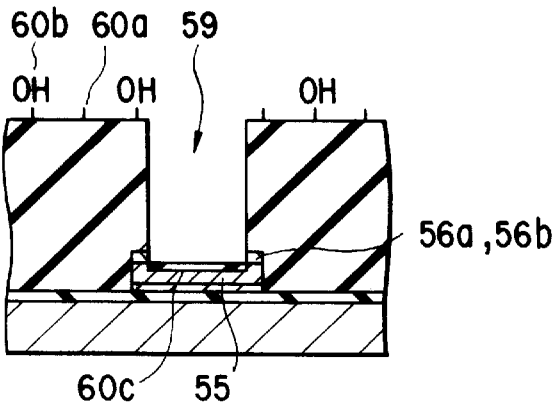

As shown in FIG. 7D, a contact hole 59 was formed in the $SiO_2$ film 58 positioned on the interconnection 57 using conventional photo lithography and reactive ion etching. The contact hole 59 extends through the Ti film 56$a$ and the TiN film 56$b$ to expose the Al alloy film 55 at its bottom portion.

Defects such as dangling bonds 60$a$ and portions 60$b$ terminated with hydroxyl groups (—OH) due to silicon more than the stoichiometric composition are present on the surface of the insulating film 58. In addition, an RIE residue in formation of the contact hole or a contaminated layer 60$c$ such as an aluminum oxide layer formed upon exposing the semiconductor substrate to the atmosphere in formation of the contact hole 59 is present on the bottom surface of the contact hole 59.

Such an RIE contaminated layer at the bottom portion of the contact hole hampers chemical vapor deposition (CVD) of tungsten (W) on the exposed surface of the Al alloy layer at the bottom portion of the contact hole. Thus, the RIE contaminated layer must be removed before CVD of tungsten. In this embodiment, before the tungsten CVD process, preprocess for removing the RIE contaminated layer was performed by sputter etching using $Ar^+$ ions. This preprocess using sputter etching will be described below.

Before a preprocess using sputter etching, the organic resist used as a mask in RIE was peeled off from the semiconductor substrate having the contact hole formed by RIE. This semiconductor substrate was loaded into a load lock chamber 101 shown in FIG. 1. The load lock chamber 101 was evacuated, and the semiconductor substrate was conveyed from the load lock chamber 101 onto a susceptor 302 in a preprocess chamber 301 by a conveyance robot 205. Next, a valve 306 was opened to supply a predetermined amount of Ar gas into the preprocess chamber 301 through a pipe 307 while the flow rate was controlled by a mass flow controller 308. At this time, the opening ratio of a conductance valve 303 was adjusted to set the Ar pressure in the preprocess chamber at $5 \times 10^{-2}$ Pa. Thereafter, a radio frequency of 13.56 MHz was applied to a high-frequency electrode buried in the susceptor 302 to generate a plasma in the preprocess chamber 301. At the same time, a DC voltage of approximately −100V was superposed on the radio frequency to increase the incident energy of $Ar^+$ ions on the semiconductor substrate and also improve the rectilinear movement of the incident $Ar^+$ ions, thereby prompting the effect of sputter etching of the Al alloy surface exposed at the bottom portion of the contact hole.

Figure 7E:
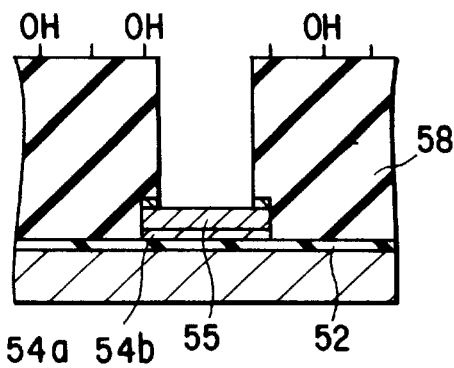

By cleaning the Al alloy surface by sputter etching for a predetermined time, the RIE contaminated layer was removed from the Al alloy surface, as shown in FIG. 7E. Application of the radio frequency and DC voltage was stopped, and supply of Ar was stopped. The preprocess chamber was evacuated to $1\times10^{-4}$ Pa or less. The semiconductor substrate was conveyed onto the susceptor in a reaction chamber 401 by the conveyance robot 205. During this conveyance, the preprocess chamber 301, a conveyance chamber 201, and the reaction chamber 401 were kept at a pressure of $5\times10^{-4}$ Pa or less by a vacuum pump, thereby preventing the cleaned Al alloy surface from reoxidizing.

The semiconductor substrate mounted on a susceptor 410 in the reaction chamber 401 was heated to 220° C. by a heater 409 incorporated in the susceptor. When the temperature of the semiconductor substrate reached 220° C., a predetermined amount of triethylsilanol ($Si(C_2H_5)_3OH$) was supplied into the reaction chamber 401 while the flow rate was controlled. Liquid triethylsilanol 422 was stored in a vessel (cylinder) 421 which could be tightly closed. The triethylsilanol 422 in the cylinder 421 was gasified by bubbling using argon gas as a carrier gas. A valve 426 was opened to supply the gasified triethylsilanol into the reaction chamber 401 through a pipe 427 while the flow rate was controlled by a mass flow controller 425. At this time, the cylinder 421, the pipe 427, the mass flow controller 425, and the valve 426 were heated to about 50° C. by a heating means 424 to raise the vapor pressure of triethylsilanol and prevent condensation of triethylsilanol.

The partial pressure of triethylsilanol in the process chamber was estimated to be roughly $10^{-5}$ Pa on the basis of the pressure of argon gas as a carrier gas in bubbling and the vapor pressure of triethylsilanol.

Figure 7F:
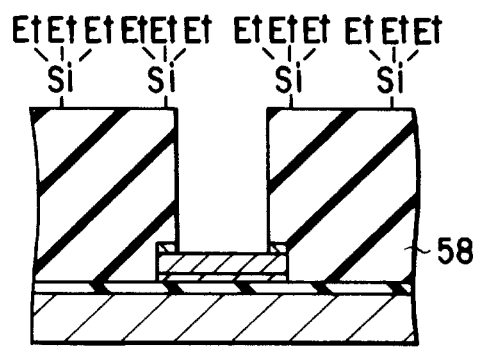

As the semiconductor substrate is loaded into the process chamber almost simultaneously with introduction of triethylsilanol, the semiconductor substrate is exposed to an atmosphere containing triethylsilanol or its reaction product. Triethylsilanol is selectively chemically adsorbed in the defects 60a and 60b on the surface of the insulating film 58, as shown in FIG. 7F to prevent these defects from becoming nuclei for tungsten growth when $WF_6$ and $SiH_4$ as a CVD source gas are supplied.

More specifically, triethylsilanol is physically adsorbed in the surface of the insulating film through its hydroxyl groups first. The hydroxyl groups of triethylsilanol, which is physically adsorbed in the surface of the insulating film 58, immediately react with the dangling bonds 60a or hydroxyl groups 60b on the insulating film surface to form a firm chemical bond Si—O—Si. With this process, the defects 60a and 60b are considered to be terminated with ethyl groups of triethylsilanol, as shown in FIG. 7E. Since the ethyl group has a closed shell structure, i.e., it hardly transfers electrons, $WF_6$ or $SiH_4$ is barely adsorbed in the defects 60a and 60b, so tungsten growth on the surface of the insulating film 58 can be suppressed. That is, "selectivity loss" can be prevented.

Figure 7G:
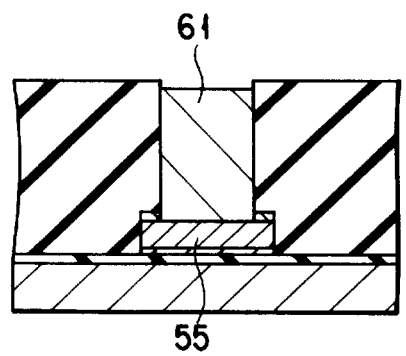

In the contact hole 59, decomposition of $WF_6$ to tungsten progresses on the conductive surface. Therefore, a tungsten layer 61 can be selectively grown only on the Al alloy film 55, as shown in FIG. 7G. After the film formation process of the tungsten layer is performed for a predetermined time, supply of $WF_6$ and $SiH_4$ into the reaction chamber is stopped, thus completing formation of the tungsten film. Simultaneously, supply of triethylsilanol into the reaction chamber is stopped.

The relationship between the interconnection pitch and the short yield was checked for each of the manufacturing method of the sixth embodiment and the conventional manufacturing method in the following manner.

Figure 8:
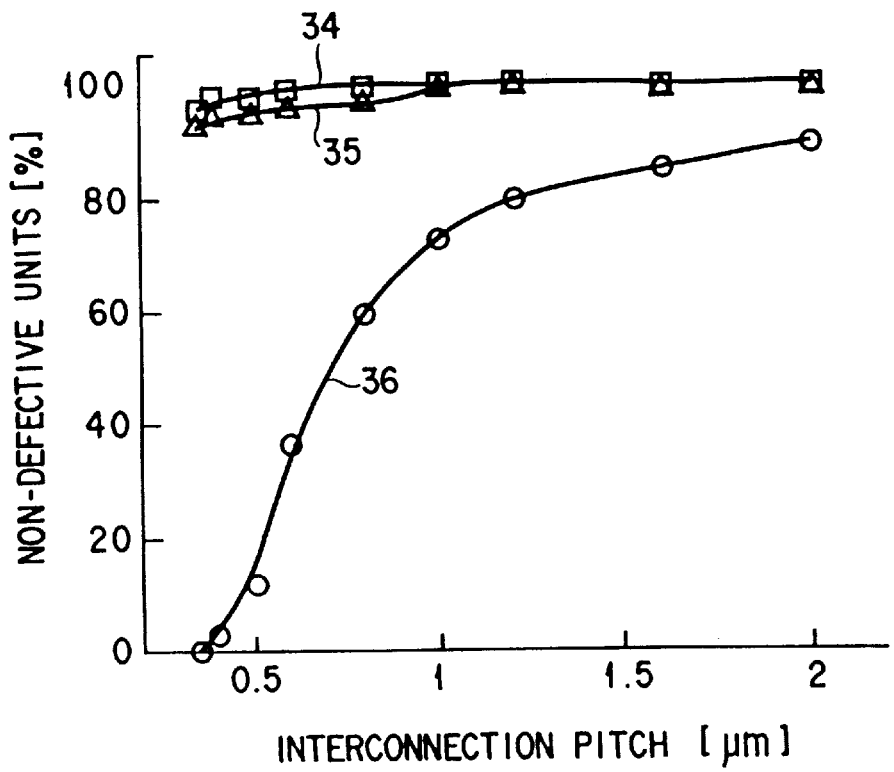
FIG. 8 is a graph showing the relationship between the interconnection pitch and the short yield.

Using each of the manufacturing method of the sixth embodiment and the conventional manufacturing method, a contact hole having a diameter of 0.5 μm and formed on the surface of a substrate and was filled with tungsten, and thereafter, aluminum interconnections were formed on the resultant structure. More specifically, in the manufacturing method of the sixth embodiment, after preprocess was performed using Ar ions, alkylsilanol and $WF_6$ and $SiH_4$ as a CVD source gas were supplied into the reaction chamber to form a tungsten plug. In the conventional manufacturing method, after preprocess was performed using Ar ions, $WF_6$ and $SiH_4$ as a CVD source gas were supplied into the reaction chamber without using alkylsilanol to form a tungsten plug. The aluminum interconnections were formed at various pitches, and the short yield between the aluminum interconnections was measured. FIG. 8 shows the measurement results.

FIG. 8 is a graph showing the relationship between the interconnection pitch and the short yield. In FIG. 8, the abscissa represents the aluminum interconnection pitch, and the ordinate represents the ratio of non-defective units. Curves 34 and 36 indicate data in use of the manufacturing method of the sixth embodiment and the conventional manufacturing method, respectively.

As is apparent from FIG. 8, when the interconnection pitch was reduced in use of the conventional manufacturing method, the ratio of non-defective units largely lowered. To the contrary, in the manufacturing method of the sixth embodiment, even when the interconnection pitch was made small, a high ratio of non-defective units was maintained. That is, when the manufacturing method of the sixth embodiment was used, the short yield could be greatly improved as compared to the conventional manufacturing method. As described above, sputter etching using inert gas ions such as Ar ions has an effect of removing aluminum oxide or RIE contaminated layer on the Al interconnection surface. However, even when a preprocess using Ar sputter etching is combined with the conventional tungsten CVD, tungsten selective growth with sufficiently high selectively as a method of manufacturing a semiconductor device cannot be realized.

Figure 9:
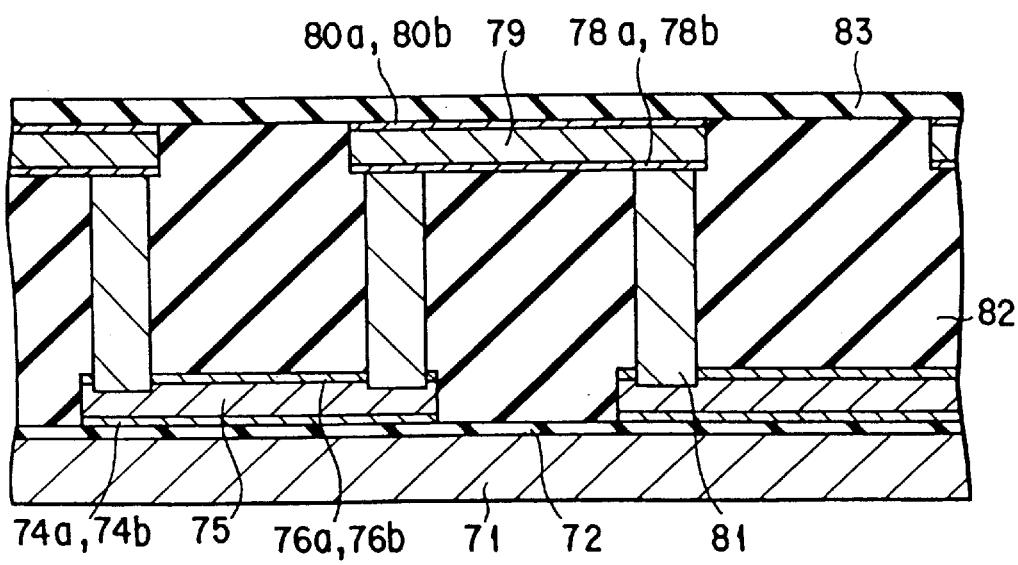
FIG. 9 is a sectional view of a semiconductor device manufactured by the manufacturing methods of the sixth and seventh embodiments of the present invention.

The electrical characteristics of the tungsten plug formed by the method of this embodiment were checked for a semiconductor device shown in FIG. 9.

FIG. 9 is a sectional view of a semiconductor device manufactured using the manufacturing method of the sixth embodiment of the present invention. An insulating film 72 is formed on a silicon substrate 71. A multilayer formed by sequentially stacking a Ti film 74a, a TiN film 74b, an Al alloy film 75, a Ti film 76a, and a TiN film 76b is provided on the insulating film 72. This stacked metal film is patterned into interconnections using conventional photo lithography technique and reactive ion etching, and an insulating film 82 is formed on the stacked metal film as the interlayer insulating film. On the insulating film 82 as well, a Ti film 78a, a TiN film 78b, an Al alloy film 79, a Ti film 80a, and a TiN film 80b are sequentially formed. The multilayer formed on the insulating film 82 and that under the insulating film 82 are staggered, and an end portion of one multilayer is connected to an end portion of the other multilayer via a tungsten via plug 81. That is, the multilayers are electrically connected to each other to form a via chain. An insulating film 83 is formed on the insulating film 82 and the multilayer formed on the insulating film 82.

The above-described semiconductor device shown in FIG. 9 was manufactured using the manufacturing method of the sixth embodiment. The length of the via plug 81 (depth of the contact hole) was 1 μm. The diameter of the via plug was changed within the range of 0.3 to 1.4 μm. Two hundred thousand via chains were formed.

Figure 10:
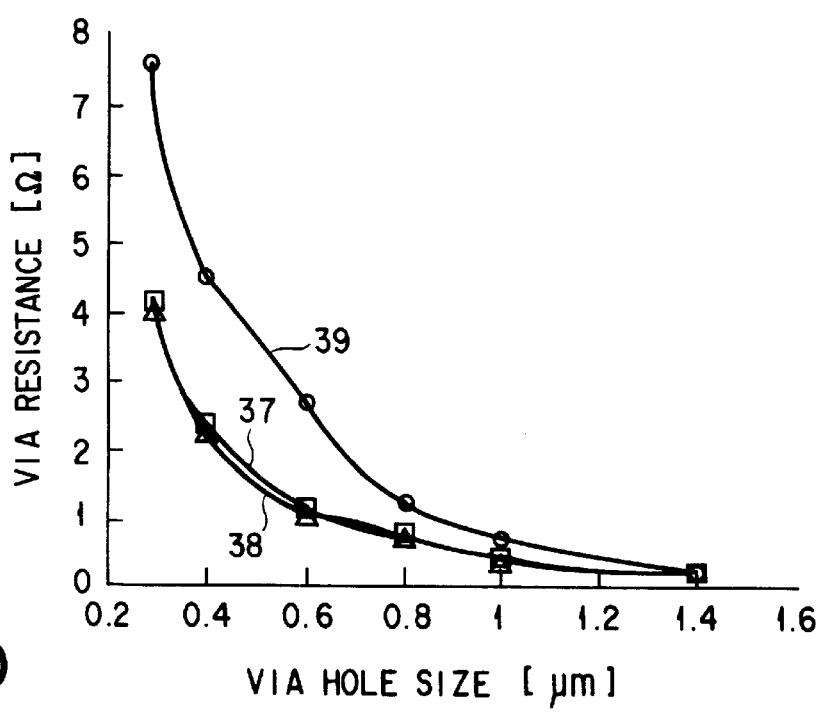
FIG. 10 is a graph showing the relationship between the via hole size and the electrical resistance value of a via chain.

The electrical resistance value of each via chain of this semiconductor device was measured, and the relationship between the via plug size (via hole size) and the electrical resistance value was checked. FIG. 10 shows the results.

FIG. 10 is a graph showing the relationship between the via hole size and the electrical resistance value of the via chain. In FIG. 10, the abscissa represents the via hole diameter, and the ordinate represents the via resistance. The via resistance is a value obtained by dividing the electrical resistance value of the via chain by the number of via plugs, i.e., 200,000. A curve 37 in FIG. 10 indicates data of the semiconductor device manufactured using the method of the sixth embodiment. More specifically, the data indicated by the curve 37 is the average resistance of via plugs manufactured by performing a preprocess using Ar ion sputtering on the exposed Al alloy interconnection surface and selectively growing tungsten while supplying triethylsilanol. A curve 39 indicates the average resistance of via plugs manufactured by performing a preprocess by not Ar ion sputtering but RIE using $BCl_3$ on the exposed Al alloy interconnection surface and selectively growing tungsten while supplying triethylsilanol.

As is apparent from FIG. 10, the electrical resistance value represented by the curve 39 is smaller than that represented by the curve 37 independently of the via hole size, and especially, this effect becomes larger as the via hole size becomes smaller. When tungsten selective CVD is to be performed while supplying an alkylsilanol such as triethylsilanol, the selectivity of tungsten growth can be increased by performing preprocess by sputter etching using inert gas ions having high directivity. Additionally, with this preprocess, a tungsten plug having excellent electrical characteristics can be formed.

The relationship between the time of supply of a gas (triethylsilanol) for suppressing selectivity loss and the time of supply of a gas ($WF_6$ and $SiH_4$) used as a material of a metal to be selectively grown is the same as in the above-described first embodiment.

Additionally, as in the first embodiment, before the semiconductor substrate is conveyed into the process chamber, the gas for suppressing selectivity loss is supplied into the process chamber in advance to chemically modify the inner surface of the process chamber.

In this embodiment, triethylsilanol was used as an alkylsilanol. However, even when a silicon compound having another alkyl group is used, the selectivity can be increased as in the first embodiment. In addition, even when a silicon compound in which alkyl groups are substituted with fluorocarbon groups such as trifluorocarbon groups is used, the same effect as described above can be obtained.

The seventh embodiment of the present invention using the manufacturing apparatus shown in FIG. 1 will be described next with reference to FIGS. 7A to 7G. In this embodiment, after preprocess by sputter etching using Ar ions is performed, tungsten selective CVD is performed while supplying an alkylhalogen silicon compound, thereby forming a tungsten plug.

As in the sixth embodiment, a semiconductor substrate having a microstructure shown in FIG. 7D was manufactured. This semiconductor substrate was conveyed into a load lock chamber 101 shown in FIG. 1. The load lock chamber was evacuated, and thereafter, the semiconductor substrate was conveyed from the load lock chamber 101 onto a susceptor 302 in a preprocess chamber 301. Next, a valve 306 was opened to supply a predetermined amount of Ar gas into the preprocess chamber 301 through a pipe 307 while the flow rate was controlled by a mass flow controller 308. At this time, the opening ratio of a conductance valve 303 was adjusted to set the pressure in the preprocess chamber at $5 \times 10^{-2}$ Pa. A radio frequency of 13.56 MHz was applied to a high-frequency electrode filled in the susceptor 302 to generate a plasma in the preprocess chamber 301. At the same time, a DC voltage of approximately −100V was superposed on the radio frequency to increase the incident energy of $Ar^+$ ions on the semiconductor substrate and also improve the rectilinear movement of the incident $Ar^+$ ions, thereby prompting the effect of sputter etching of the Al alloy surface exposed at the bottom portion of the contact hole.

By cleaning the Al alloy surface by sputter etching for a predetermined time, the RIE contaminated layer was removed from the Al alloy surface, as shown in FIG. 7E. Application of the radio frequency and DC voltage was stopped, and supply of Ar was stopped. The preprocess chamber was evacuated to $1 \times 10^{-4}$ Pa or less. The semiconductor substrate was conveyed onto a susceptor 410 in a reaction chamber 401 by a conveyance robot 205. During this conveyance, the preprocess chamber 301, a conveyance chamber 201, and the reaction chamber 401 were kept at a pressure of $5 \times 10^{-4}$ Pa or less by a vacuum pump, thereby preventing the cleaned Al alloy surface from reoxidizing.

The semiconductor substrate was mounted on the susceptor 410 in the reaction chamber 401 and heated to 230° C. by a heater 409 incorporated in the susceptor. A predetermined amount of triethylchlorosilane was supplied into the reaction chamber 401 while the flow rate was controlled by a mass flow controller. The triethylchlorosilane was gasified by normal bubbling using argon gas as a carrier gas and supplied into the process chamber. The partial pressure of triethylchlorosilane in the process chamber was estimated to be roughly $10^{-5}$ Pa on the basis of the pressure of argon gas as a carrier gas in bubbling and the vapor pressure of triethylchlorosilane.

As the semiconductor substrate is conveyed into the process chamber almost simultaneously with introduction of triethylchlorosilane, the semiconductor substrate is exposed to an atmosphere containing triethylchlorosilane or its reaction product. Triethylchlorosilane is selectively chemically adsorbed in defects 60a and 60b on the surface of an insulating film 58, as shown in FIG. 7F to prevent these defects from becoming nuclei for tungsten growth when $WF_6$ and $SiH_4$ as a CVD source gas are supplied.

More specifically, triethylchlorosilane is physically adsorbed in the insulating film surface through its chlorine atoms first. The triethylchlorosilane which is physically adsorbed in the surface of the insulating film 14 immediately reacts with the dangling bonds 60a or hydroxyl groups 60b on the insulating film surface to form firm chemical bonds Si—O—Si, Si—Si, and Si—Cl. With this process, the defects 16a and 16b are considered to be terminated with the ethyl groups of triethylsilane or chlorine atoms, as shown in FIG. 7F. $WF_6$ or $SiH_4$ is barely adsorbed in the defects 60a and 60b, so tungsten growth on the surface of the insulating film 58 can be suppressed. That is, "selectivity loss" can be prevented.

In a contact hole 59, decomposition of $WF_6$ to tungsten progresses on the conductive surface. Therefore, a tungsten layer 61 can be selectively grown only on an Al alloy film 55, as shown in FIG. 7G. At this time, triethylchlorosilane is considered to react with the exposed aluminum surface to form aluminum chloride. This aluminum chloride has a relatively high vapor pressure. For this reason, the aluminum chloride evaporates due to heat given to the substrate in tungsten growth, so the aluminum surface is kept clean. Therefore, when triethylchlorosilane is used, "selectivity loss" can be effectively prevented without hindering tungsten growth on the Al interconnection.

A semiconductor device as shown in FIG. 9 was manufactured following the same procedure as in the sixth embodiment except that the semiconductor device was manufactured using the manufacturing method of the seventh embodiment. More specifically, a preprocess by sputter etching using Ar ions was performed, and tungsten selective CVD was performed while supplying triethylchlorosilane.

The electrical resistance value of each via chain of this semiconductor device was measured, and the relationship between the via plug size (via hole size) and the electrical resistance value was checked. FIG. 10 shows the results. In FIG. 10, data for the semiconductor device obtained by the method of the seventh embodiment is indicated by a curve 38.

A semiconductor device as shown in FIG. 9 was also manufactured by performing a preprocess by not Ar ion sputter etching but RIE using $BCl_3$ and tungsten selective CVD while supplying triethylchlorosilane. Data for this semiconductor device is indicated by a curve 39.

As is apparent from FIG. 10, the electrical resistance value represented by the curve 38 is smaller than that represented by the curve 39 independently of the via hole size, and especially, this effect becomes larger as the via hole size becomes smaller. When tungsten selective CVD is to be performed while supplying an alkylhalogen silicon compound such as triethylchlorosilane, the selectivity of tungsten growth can be increased by performing a preprocess by sputter etching using inert gas ions having high directivity. Additionally, with this preprocess, a tungsten plug having excellent electrical characteristics can be formed.

The relationship between the time of supply of a gas (triethylchlorosilane) for suppressing selectivity loss and the time of supply of a gas ($WF_6$ and $SiH_4$) used as a material of a metal to be selectively grown is the same as in the above-described first embodiment.

Additionally, as in the first embodiment, before the semiconductor substrate is conveyed into the process chamber, the gas for suppressing selectivity loss is supplied into the process chamber in advance to chemically modify the inner surface of the process chamber.

In this embodiment, triethylchlorosilane was used as an alkylhalogen silicon compound. Even when a silicon compound in which halogen atoms or alkyl groups are bonded to silicon atoms is used, the selectivity can be improved as in the second embodiment. Even when a silicon compound in which alkyl groups are substituted with fluorocarbon groups such as trifluorocarbon groups is used, the same effect as described above can be obtained.

The eighth embodiment of the present invention using the manufacturing apparatus shown in FIG. 1 will be described next with reference to FIGS. 11A to 11G. In this embodiment, a microstructure different from that of the sixth and seventh embodiments is formed, and a tungsten plug is formed therein.

FIGS. 11A to 11G are sectional views showing steps in manufacturing a semiconductor device of the eighth embodiment of the present invention.

Figure 11A:
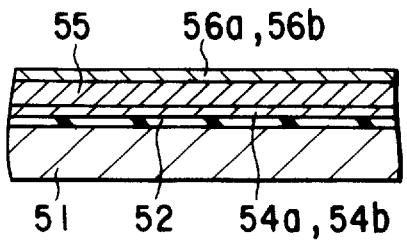
FIGS. 11A to 11G are sectional views schematically showing steps in manufacturing a semiconductor device of the eighth embodiment of the present invention.

As shown in FIG. 11A, an insulating film ($SiO_2$ film) 52 having a thickness of 100 nm was formed on a silicon substrate 51. A titanium (Ti) film 54a having a thickness of 10 nm and a titanium nitride (TiN) film 54b having a thickness of 20 nm were sequentially formed on the $SiO_2$ film 52 by sputtering. An Al alloy film 55 having a thickness of 400 nm was formed by sputtering. A Ti film 56a having a thickness of 5 nm and a TiN film 56b having a thickness of 60 nm were sequentially formed on the Al alloy film 55 by sputtering.

Figure 11B:
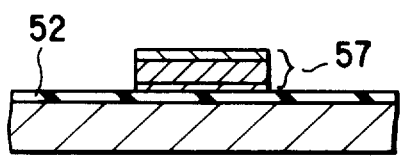

As shown in FIG. 11B, the stacked metal thin film layer, i.e., the TiN/Ti/Al alloy/TiN/Ti layer was patterned into a desired pattern by conventional photo lithography and reactive ion etching to form an interconnection 57.

Figure 11C:
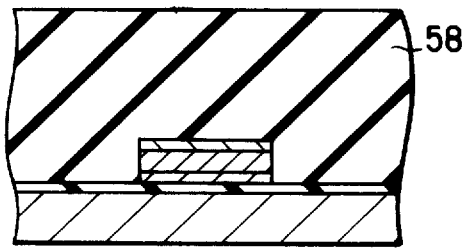

As shown in FIG. 11C, an $SiO_2$ film 58 having a thickness of 1 μm was formed by plasma CVD using TEOS (tetraethoxysilane) and $O_2$ as a source gas. The $SiO_2$ film 58 corresponds to a interlayer insulating film.

Figure 11D:
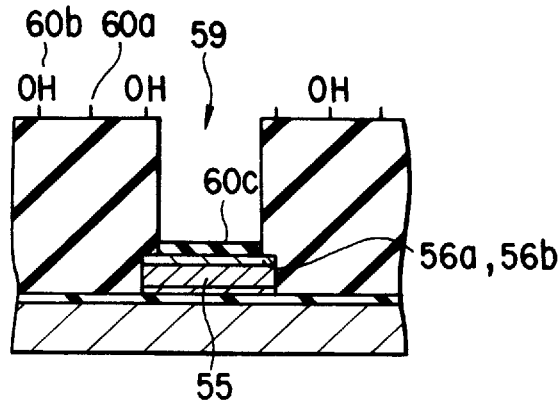

As shown in FIG. 11D, a contact hole 59 was formed in the $SiO_2$ film 58 positioned on the interconnection 57 using conventional photo lithography and reactive ion etching. The contact hole 59 extends in the Ti film 56b to expose the TiN film 56b at its bottom portion.

This semiconductor substrate was conveyed into a load lock chamber 101 shown in FIG. 1. The load lock chamber was evacuated, and the semiconductor substrate was conveyed from the load lock chamber 101 onto a susceptor 302 in a preprocess chamber 301. Next, a valve 306 was opened to supply a predetermined amount of Ar gas into the preprocess chamber 301 through a pipe 307 while the flow rate was controlled by a mass flow controller 308. At this time, the opening ratio of a conductance valve 303 was adjusted to set the pressure in the preprocess chamber at $5 \times 10^{-2}$ Pa. A radio frequency of 13.56 MHz was applied to a high-frequency electrode filled in the susceptor 302 to generate a plasma in the preprocess chamber 301. At the same time, a DC voltage of approximately −100V was superposed on the radio frequency to increase the incident energy of $Ar^+$ ions on the semiconductor substrate and also improve the rectilinear movement of the incident $Ar^+$ ions, thereby prompting the effect of sputter etching of the TiN surface exposed at the bottom portion of the contact hole.

Figure 11E:
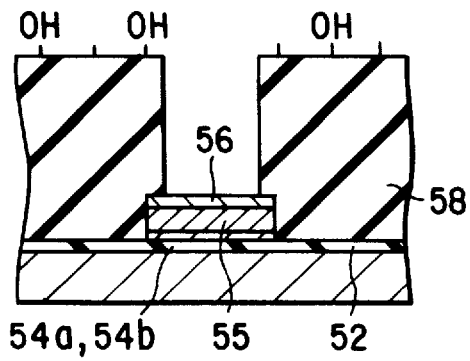

By cleaning the TiN surface by sputter etching for a predetermined time, an RIE contaminated layer 60c was removed from the surface of the TiN film 56b, as shown in FIG. 11E. Application of the radio frequency and DC voltage was stopped, and supply of Ar was stopped. The preprocess chamber was evacuated to $1 \times 10^{-4}$ Pa or less. The semiconductor substrate was conveyed onto a susceptor in a reaction chamber 401 by a conveyance robot 205. During this conveyance, the preprocess chamber 301, a conveyance chamber 201, and the reaction chamber 401 were kept at a pressure of $5 \times 10^{-4}$ Pa or less by a vacuum pump, thereby preventing the cleaned TiN film surface from reoxidizing.

The semiconductor substrate mounted on a susceptor 410 in the reaction chamber 401 was heated to 300° C. by a heater 409 incorporated in the susceptor. A predetermined amount of triethylsilanol was supplied into the reaction chamber 401 while the flow rate was controlled by a mass flow controller. The triethylsilanol was gasified by normal bubbling using argon gas as a carrier gas and supplied into the process chamber. The partial pressure of triethylsilanol in the process chamber was estimated to be approximately $10^{-5}$ Pa on the basis of the pressure of argon gas as a carrier gas in bubbling and the vapor pressure of triethylsilanol.

Figure 11F:
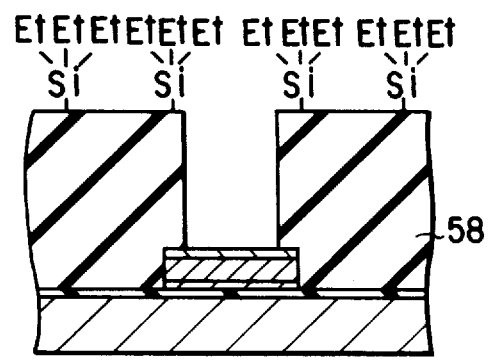

The semiconductor substrate is exposed to an atmosphere containing triethylsilanol or its reaction product. Triethylsilanol is selectively chemically adsorbed in defects 60a and 60b on the surface of the insulating film 58, as shown in FIG. 11F, to prevent these defects from becoming nuclei for tungsten growth.

Figure 11G:
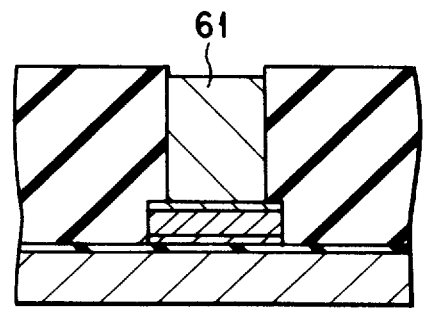

Next, $WF_6$ and $SiH_4$ as a CVD source gas were supplied into the reaction chamber to deposit tungsten for a predetermined time. Deposition of tungsten was ended by stopping supply of $WF_6$ and $SiH_4$ into the reaction chamber. At the same time, supply of triethylsilanol into the reaction chamber was also stopped. As a result, tungsten was selectively grown on the interconnection 57, so a tungsten layer 61 could be formed, as shown in FIG. 11G.

Using the method of the eighth embodiment, a contact hole having a diameter of 0.5 $\mu$m was filled with tungsten, and aluminum interconnections were formed on the resultant structure. The interconnections were formed at various pitches, and the relationship between the short yield between the aluminum interconnections and the interconnection pitch was checked. In addition, a tungsten plug was formed following the same procedure as the eighth embodiment except that triethylsilanol was used, and the short yield between the aluminum interconnections was measured. FIG. 8 shows the results.

In FIG. 8, data obtained by the manufacturing method of the eighth embodiment is indicated by a curve 35, and data obtained when the tungsten plug was formed without using triethylsilanol is indicated by a curve 36 as described in the sixth embodiment.

In the manufacturing method of the eighth embodiment, not an aluminum film but a TiN film was used as an underlayer for tungsten selective growth. Generally, it is more difficult to grow tungsten on the TiN film than on the aluminum film. For this reason, it is reckoned that when the TiN underlayer is used, the film formation temperature must be higher than that in use of aluminum underlayer. Such a high film formation temperature readily generates nuclei (selectivity loss) for tungsten on the insulating film ($SiO_2$ film). However, as shown in FIG. 8, according to the manufacturing method of the eighth embodiment, even under an environment prone to selectivity loss, the tungsten plug can be selectively grown while maintaining sufficient selectivity.

In this embodiment, TiN was used as a material used for an underlayer for tungsten selective growth. A conductive nitride other than TiN or a conductive silicide, e.g., tungsten nitride, titanium silicide, tungsten silicide, cobalt silicide, or nickel silicide can also be used.

The relationship between the time of supply of a gas (triethylsilanol) for suppressing selectivity loss and the time of supply of a gas ($WF_6$ and $SiH_4$) used as a material of a metal to be selectively grown is the same as in the above-described first embodiment.

Additionally, as in the first embodiment, before the semiconductor substrate is conveyed into the process chamber, the gas for suppressing selectivity loss is supplied into the process chamber in advance to chemically modify the inner surface of the process chamber.

In this embodiment, triethylsilanol was used as an alkylsilanol. However, even when a silicon compound having another alkyl group is used, the selectivity can be increased as in the first embodiment. In addition, even when a silicon compound in which alkyl groups are substituted with fluorocarbon groups such as trifluorocarbon groups is used, the same effect as described above can be obtained.

In the sixth to eighth embodiments, when the bottom portion of the contact hole is to be cleaned by sputtering using inert gas ions such as Ar, a very small quantity (e.g., 10 vol % or less of Ar gas) of gas containing a halogen element may be added. In this case, damage to the surface due to physical sputtering using inert gas ions can be recovered by the chemical etching effect of the halogen element. Embodiments of the gas containing a halogen element which can be added to the inert gas are $F_2$, $NF_3$, HBr, $BCl_3$, and $Cl_2$. The gas containing a halogen element can be supplied into the process chamber simultaneously with, before, or after the start of sputtering. Supply of the gas containing a halogen element into the process chamber is preferably stopped at the end of sputtering. Instead of independently supplying the inert gas and the gas containing a halogen element into the process chamber, a gas mixture (e.g., a gas containing $F_2$ gas corresponding to 10 vol % of the Ar gas) formed by adding the gas containing a small quantity of halogen element to the inert gas in advance may be supplied.

As has been described above, according to the present invention, the insulating film surface is chemically modified with a silicon compound or its reaction product and becomes inactive. For this reason, when a metal film is to be selectively grown on the conductive surface, undesirable growth of the metal film on the insulating film surface can be suppressed. As a result, since the selectivity of metal film growth is increased, selective growth of the metal is stabilized, and the electrical connection characteristics between the selectively grown metal film and the lower interconnections can be improved. In addition, when the surfaces of silica members in the process chamber are chemically modified in advance using an atmosphere containing the silicon compound or its decomposition product, deposition of the metal film on the silica member surfaces can be suppressed, so generation of dust in the process chamber can be prevented. Therefore, maintenance/management of the process chamber can be facilitated.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming an insulating film and a first metal film on one major surface of a semiconductor substrate, each of said insulating film and said first metal film having a partially exposed surface; and selectively forming a second metal film on the exposed surface of said first metal film by a selective growth method, wherein formation of said second metal film is performed in an atmosphere which contains a silicon compound consisting of silicon, carbon, and at least one element selected from the group consisting of hydrogen, oxygen, and a halogen, and in which elements bonded to silicon are selected from the group consisting of silicon, carbon, oxygen, and a halogen, whereby the exposed surface of said insulating film is chemically modified with the silicon compound or a reaction product thereof.

2. A method according to claim 1, wherein the elements bonded to silicon in the silicon compound are selected from the group consisting of silicon, carbon, and oxygen, and the silicon compound has one hydroxyl group bonded to silicon.

3. A method according to claim 2, wherein the elements bonded to carbon in the silicon compound are selected from the group consisting of silicon, carbon, and a halogen.

4. A method according to claim 1, wherein the silicon compound is at least one compound selected from the group consisting of an alkylsilanol, a polymer thereof, and a reaction product thereof.

5. A method according to claim 1, wherein the silicon compound is at least one compound selected from the group consisting of a trialkylsilanol, a polymer thereof, and a reaction product thereof.

6. A method according to claim 1, wherein the silicon compound has one halogen atom bonded to silicon.

7. A method according to claim 6, wherein the silicon compound contains oxygen, and the oxygen is bonded only to silicon.

8. A method according to claim 1, wherein the silicon compound is at least one compound selected from the group consisting of an alkylhalogen silicon, a polymer thereof, and a reaction product thereof.

9. A method according to claim 1, wherein the silicon compound is at least one compound selected from the group consisting of a trialkylhalogen silicon, a polymer thereof, and a reaction product thereof.

10. A method according to claim 1, wherein the silicon compound has an alkyl group selected from the group consisting of a methyl group, an ethyl group, a propyl group, and a butyl group.

11. A method according to claim 1, wherein the silicon compound has an alkyl group having at least one hydrogen atom substituted with a fluorine atom.

12. A method according to claim 1, wherein the silicon compound has a fluorocarbon group.

13. A method according to claim 1, further comprising, before formation of said second metal film, sputtering the surface of said first metal film with inert gas ions to clean the surface.

14. A method according to claim 13, wherein a gas containing a halogen element is added in the sputtering step.

15. A method according to claim 13, wherein the inert gas ions are generated from a plasma.

16. A method according to claim 1, wherein said insulating film has a removed portion, and said first metal film is partially exposed at a bottom portion of the removed portion of said insulating film.

17. A method according to claim 16, wherein the removed portion is a hole or a trench formed in said insulating film.

18. A method according to claim 1, wherein said chemical modification of the exposed surface of the insulating film with the silicon compound or the reaction product thereof is started before formation of said second metal film.

19. A method according to claim 1, wherein said chemical modification of the exposed surface of the insulating film with the silicon compound or the reaction product thereof is ended after formation of said second metal film.

20. A method according to claim 1, wherein formation of said second metal film includes controlling, in a process chamber where said second metal film is formed, a partial pressure P of a gas forming the atmosphere containing the silicon compound within the range of $10^{-6}$ Pa<P<$10^{-4}$ Pa.

21. A method according to claim 1, wherein the atmosphere containing the silicon compound chemically modifies a surface of a silica member in a process chamber where said second metal film is formed.

22. A method according to claim 1, wherein said second metal film is essentially made of at least one metal selected from the group consisting of tungsten, copper, aluminum, and titanium.

23. A method of manufacturing a semiconductor device, comprising the steps of:

forming an insulating film and a first metal film on one major surface of a semiconductor substrate, each of said insulating film and said first metal film having a partially exposed surface; and selectively forming a second metal film on the exposed surface of said first metal film by selective CVD, wherein formation of said second metal film is performed in an atmosphere containing a gasified silicon compound obtained upon gasifying a liquid silicon compound consisting of silicon, carbon, and at least one element selected from the group consisting of hydrogen, oxygen, and a halogen, and in which elements bonded to silicon are selected from the group consisting of silicon, carbon, oxygen, and a halogen, whereby the exposed surface of said insulating film is chemically modified with the silicon compound or a reaction product thereof.

24. A method of manufacturing a semiconductor device, comprising the steps of:

forming an insulating film and a first metal film on one major surface of a semiconductor substrate, each of said insulating film and said first metal film having a partially exposed surface;

sputtering, using inert gas ions, said first metal film on said semiconductor film on which said insulating film and said first metal film are formed, thereby cleaning said first metal film; and selectively forming a second metal film on the cleaned exposed surface of said first metal film by a selective growth method, wherein formation of said second metal film is performed in an atmosphere containing a gasified silicon compound obtained upon gasifying a liquid silicon compound consisting of silicon, carbon, and at least one element selected from the group consisting of hydrogen, oxygen, and a halogen, and in which elements bonded to silicon are selected from the group consisting of silicon, carbon, oxygen, and a halogen, whereby the exposed surface of said insulating film is chemically modified with the silicon compound or a reaction product thereof.

25. A method of manufacturing a semiconductor device, comprising the steps of:

forming a metal interconnection on one major surface of a semiconductor substrate;

forming an insulating film on said major surface of said semiconductor substrate on which said interconnection is formed;

partially removing said insulating film to form a contact hole and at least partially expose a surface of said interconnection; and selectively forming a metal plug on the exposed surface of said interconnection by a selective growth method, wherein formation of said metal plug is performed in an atmosphere containing a gasified silicon compound obtained upon gasifying a liquid silicon compound consisting of silicon, carbon, and at least one element selected from the group consisting of hydrogen, oxygen, and a halogen and in which elements bonded to silicon are selected from the group consisting of silicon, carbon, oxygen, and a halogen, whereby the exposed surface of said insulating film is chemically modified with the silicon compound or a reaction product thereof.

26. A method of manufacturing a semiconductor device, comprising the steps of:

forming an insulating film on one major surface of a semiconductor substrate;

partially removing said insulating film to form an interconnection trench;

forming a metal film in the interconnection trench and on said insulating film;

selectively removing said metal film formed on said insulating film while leaving said metal film formed in the interconnection trench; and selectively forming a metal interconnection on said metal film formed in the interconnection trench by a selective growth method, wherein formation of said metal interconnection is performed in an atmosphere containing a gasified silicon compound obtained upon gasifying a liquid silicon compound consisting of silicon, carbon, and at least one element selected from the group consisting of hydrogen, oxygen, and a halogen, and in which elements bonded to silicon are selected from the group consisting of silicon, carbon, oxygen, and a halogen, whereby the exposed surface of said insulating film is chemically modified with the silicon compound or a reaction product thereof.

* * * * *